(12) United States Patent
Goundar et al.

(10) Patent No.: US 6,991,959 B2
(45) Date of Patent: Jan. 31, 2006

(54) METHOD OF MANUFACTURING SILICON CARBIDE FILM

(75) Inventors: Kamal Kishore Goundar, Tama (JP); Kiyoshi Satoh, Tama (JP)

(73) Assignee: ASM Japan K.K., Tokyo (JP)

(*) Notice: Subject to any disclaimer, the term of this patent is extended or adjusted under 35 U.S.C. 154(b) by 59 days.

(21) Appl. No.: 10/722,179

(22) Filed: Nov. 25, 2003

(65) Prior Publication Data

US 2004/0115876 A1 Jun. 17, 2004

Related U.S. Application Data

(63) Continuation-in-part of application No. 10/682,180, filed on Oct. 9, 2003.

(30) Foreign Application Priority Data

Oct. 10, 2002 (JP) ...................................... 2002-297260

(51) Int. Cl.
*H01L 21/00* (2006.01)

(52) U.S. Cl. ...................... 438/105; 438/118; 438/780; 438/781; 438/789; 438/778; 438/200; 438/623

(58) Field of Classification Search ................. 438/105, 438/780, 781, 789, 778, 200, 118, 623
See application file for complete search history.

(56) References Cited

U.S. PATENT DOCUMENTS

| | | | |
|---|---|---|---|
| 4,670,299 A | 6/1987 | Fukuyama et al. | |
| 5,800,878 A | 9/1998 | Yoa | |
| 6,147,009 A * | 11/2000 | Grill et al. ................. | 438/780 |
| 6,187,691 B1 | 2/2001 | Fukuda et al. | |
| 6,211,077 B1 | 4/2001 | Shimizu et al. | |
| 6,235,112 B1 | 5/2001 | Satoh | |
| 6,242,278 B1 | 6/2001 | Shimizu et al. | |
| 6,277,201 B1 | 8/2001 | Nishikawa | |
| 6,312,793 B1 * | 11/2001 | Grill et al. ................. | 428/312.6 |
| 6,383,900 B1 | 5/2002 | Shimizu et al. | |
| 6,436,824 B1 | 8/2002 | Chooi et al. | |
| 6,465,366 B1 * | 10/2002 | Nemani et al. ............. | 438/778 |
| 6,524,955 B2 | 2/2003 | Fukuda et al. | |
| 6,537,928 B1 | 3/2003 | Matsuki et al. | |
| 6,589,888 B2 * | 7/2003 | Nemani et al. ............. | 438/778 |
| 6,635,583 B2 * | 10/2003 | Bencher et al. ............. | 438/761 |
| 6,656,837 B2 * | 12/2003 | Xu et al. ..................... | 438/676 |
| 6,668,752 B2 | 12/2003 | Yao | |
| 6,764,958 B1 | 7/2004 | Nemani et al. | |
| 6,790,788 B2 * | 9/2004 | Li et al. ..................... | 438/778 |
| 2001/0030369 A1 | 10/2001 | MacNeil et al. | |
| 2001/0031563 A1 | 10/2001 | Shioya et al. | |
| 2001/0051445 A1 | 12/2001 | Shioya et al. | |
| 2002/0027286 A1 | 3/2002 | Sundararajan et al. | |
| 2002/0054962 A1 | 5/2002 | Huang | |
| 2003/0049388 A1 | 3/2003 | Cho et al. | |
| 2003/0194496 A1 * | 10/2003 | Xu et al. ................. | 427/255.28 |
| 2004/0067308 A1 * | 4/2004 | Zheng et al. ........... | 427/249.15 |
| 2004/0126929 A1 * | 7/2004 | Tang et al. ................. | 438/118 |

FOREIGN PATENT DOCUMENTS

JP        2001-060584        6/2001

* cited by examiner

*Primary Examiner*—David Zarneke
*Assistant Examiner*—Igwe U. Anya
(74) *Attorney, Agent, or Firm*—Knobbe Martens Olson & Bear, LLP

(57) ABSTRACT

A method for forming a silicon carbide film on a semiconductor substrate by plasma CVD includes: introducing a raw material gas containing silicon, carbon, and hydrogen, an inert gas, and optionally an hydrogen source gas, into a reaction chamber at a predetermined mixing formulation of the raw material gas to the inert gas; applying radio-frequency power at the mixing formulation, thereby forming a curable silicon carbide film having a dielectric constant of about 4.0 or higher; and continuously applying radio-frequency power at a mixing formulation reducing the raw material gas and the hydrogen source gas if any, thereby curing the silicon carbide film to give a dielectric constant and a leakage current lower than those of the curable silicon carbide film.

15 Claims, 13 Drawing Sheets

METHOD OF MANUFACTURING SILICON CARBIDE FILM

The present application is a continuation-in-part of U.S. application Ser. No. 10/682,180, filed Oct. 9, 2003, which claims priority to Japanese Patent Application No. 2002-297260, filed Oct. 10, 2003, and the disclosure of which is incorporated herein by reference in its entirety.

BACKGROUND OF THE INVENTION

1. Field of the Invention

The present invention relates to a deposition method by plasma CVD. More particularly, the present invention relates to a silicon carbide film which acts as an etch stop film used for copper wiring.

2. Description of the Related Art

Conventionally, in LSI devices including CPUs, memories, system LSIs, aluminum alloy has been used for metal interconnects. To insulate aluminum interconnects, a silicon oxide film is used; for some LSI devices, a fluorine-containing silicon oxide film is used.

In recent years, copper which has lower electrical resistivity than aluminum has been adopted as a material for metal wiring to speed up LSI devices' performance, and a carbon-containing silicon oxide film having a low dielectric constant has started to be adopted as an interlayer insulating film to reduce interconnect capacity which causes signal delay. In an LSI device having this copper wiring, an etch stop film is used to form trenches or vias for the copper wiring in a barrier layer of a carbon-containing silicon oxide film. In the past, a silicon nitride film, whose dry etching rate is slower as compared with the carbon-containing silicon oxide film and which has a function to prevent copper diffusion, has been used as an etch stop film. Because a dielectric constant of the silicon nitride film, however, is approximately 7, which is high, a problem that the silicon nitride film increases interconnect capacity on the whole occurs even if the carbon-containing silicon oxide film is applied.

To solve this problem, a technology using a silicon carbide film as an etch stop film was developed as described in, for example, U.S. Pat. No. 5,800,878.

A dielectric constant of a silicon carbide film is approximately 5 and is applied to LSI devices using copper wiring by combining with a carbon-containing silicon oxide film having a dielectric constant of approximately 3.

Typically, what are called silicon carbide films have several different compositions. One of them is a silicon carbide film comprising Si, C, and H. This film has a property of absorbing oxygen or moisture easily and has a shortcoming that its film stress or dielectric constant is changed if it is left in the atmosphere. Additionally, the film has high leakage current and provides poor electrical isolation. To solve these problems, a technology to prevent moisture or oxygen from intruding from a film surface by processing the film surface by an inert plasma gas was developed as described in, for example, U.S. Patent Publication No. 2002-0054962. The method to minimize the oxidation of carbon containing materials, such as silicon carbide, with an inert gas plasma such as helium (He), Argon (Ar) is also published in JP laid-open patent 2001/0060584.

This method, however, only improves the quality of the very surface of the film; it does not improve internal characteristics of the SiCH film; the film still has high leakage current and provides poor electrical isolation. The dielectric constant of this film is approximately 4.5 to 5; hence, application of the film to current LSI devices aiming to perform faster is difficult.

As silicon carbide films having different compositions, a silicon carbide film comprising Si, C, N, and H, a silicon carbide film comprising Si, C, O, and H, and others were disclosed, for example, in U.S. Patent Publication No. 2001-0030369, U.S. Patent Publication No. 2002-0027286, U.S. Patent Publication No. 2001-0051445, and U.S. Patent Publication No. 2001-0031563.

These silicon carbide films have lower leakage current and provide better electrical isolation as compared with the above-mentioned SiCH film. Particularly, a SiCOH film can attain a low dielectric constant of approximately 4.2 depending on an oxygen ratio. The silicon carbide films have a problem, however, that due to their chemical properties similar to a carbon-containing silicon oxide film, their etching rate difference with the carbon-containing silicon oxide film's becomes small (within 3 to 4 times), lowering their etch stop performance. Particularly, because the SiCOH film whose dielectric constant is lowered by increasing its oxygen content has a chemical composition similar to the carbon-containing silicon oxide film which is used as an insulating film for the interconnects, it is etched at a rate close to an etching rate of the carbon-containing silicon oxide film, making difficult to form vias or trenches for copper wiring to be formed by Reactive Ion Etching (RIE) using $C_4F_8+O_2+Ar$ gas. Additionally, to speed up LSI devices' performance, attaining a low dielectric constant of 4 or lower is demanded for the etch stop film.

SUMMARY OF THE INVENTION

Consequently, an object of the present invention is to provide a method of manufacturing a silicon carbide film having a dielectric constant of about 4 or lower, whose film stress is not changed when it is left in the atmosphere, and which has low leakage current and a dry etching rate extremely lower than the carbon-containing silicon oxide film's and can be used as an etch stop film for copper wiring. Another object of the present invention is to provide a method of manufacturing a silicon carbide film having characteristics suitable for an etch stop film. Still another object of the present invention is to provide a method of manufacturing a silicon carbide film which is stable in the atmosphere and resistant to environmental changes, i.e., maintains its characteristics for a period of time sufficient for practical use. Still another object of the present invention is provide a method of manufacturing a silicon carbide film without complicated processes, preferably without discontinuing film formation processes, and at high efficiency. Yet another object of the present invention is to provide a method of manufacturing a silicon carbide film environmentally stabilized uniformly both in a thickness direction and in a diametrical direction. Still another object of the present invention is to provide a method of manufacturing a semiconductor device using a silicon carbide film as an etch stop layer. Further, another object of the present invention is to provide a method of forming copper wiring in a semiconductor device.

The present invention has another object which is to deposit a silicon carbide film having a low dielectric constant with low leakage current and compressive stress onto a substrate.

To achieve the above-mentioned objects, the method of manufacturing a silicon carbide film according to the present invention comprises two steps. A first step is of forming a silicon carbide film which is environmentally unstable, uncured, semi-cured, curable, reactive, incomplete, or intermediate (i.e., the film formation reaction is not complete). These terms can be interchangeably used. A second step is of curing the silicon carbide film by completing the film formation reaction. The first step and the second step can be conducted continuously in the same reactor. In the present invention, any suitable types of silicon carbide film can be formed, including the Si—C—H type.

In an embodiment of the present invention, a method for forming a silicon carbide film on a semiconductor substrate by plasma CVD comprises the steps of: (a) introducing a raw material gas containing silicon, carbon, and hydrogen and an inert gas at a predetermined mixture ratio of the raw material gas to the inert gas into a reaction chamber; (b) applying radio-frequency power to a reaction zone inside the reaction chamber at the mixture ratio, thereby forming on a semiconductor substrate a curable silicon carbide film having a dielectric constant of about 4.0 or higher (e.g., 4.0–4.5, preferably 4.0–4.2); and (c) continuously applying radio-frequency power to the reaction zone at a mixture ratio of the raw material gas to the inert gas which is reduced from that in step (b), thereby curing the silicon carbide film to give a dielectric constant lower than that of the curable silicon carbide film (e.g., 3.5–4.0, preferably 3.7–4.0). In the above, steps (a) and (b) correspond to a film formation step (a first step), and step (c) corresponds to a curing step (a second step). The second step is mainly for curing the film, not for forming a film, although a film is formed to the extent that a raw material gas is used in the second step. However, the process conditions themselves can be similar to those in the first step, and the first step and the second step can be continuously conducted. Because the second step is for curing the film, no additional film needs to be deposited on the film in the second step, although deposition of an additional film is not excluded. Through the second step, the film formed in the first step can be fully cured in a thickness direction as well as in a diametrical direction.

In another aspect, the present invention provides a method for forming a silicon carbide film on a semiconductor substrate by plasma CVD, comprising the steps of: (I) forming a curable silicon carbide film having a dielectric constant of more than about 4.0 on a semiconductor substrate placed in a reaction chamber, by introducing a raw material gas containing silicon, carbon, and hydrogen at a given flow rate, and an inert gas at a given flow rate into the reaction chamber, and applying radio-frequency power to a reaction zone inside the reaction chamber; and (II) curing the silicon carbide film having a dielectric constant of no more than about 4.0 by discontinuously or continuously reducing and then maintaining a mixture ratio of the raw material gas to the inert gas while continuously applying radio-frequency power to the reaction zone.

In an embodiment, in step (a) or (I) above, in addition to the raw material gas and the inert gas, a hydrogen source gas may be introduced into the reaction chamber. By adding a hydrogen source gas, the resulting silicon carbide film can have a low dielectric constant with low leakage current and compressive stress.

In the above, the hydrogen source gas flow can be changed in step (c) or (II) by synchronizing the hydrogen source gas flow with the raw material gas flow or by reducing the hydrogen source gas from that in step (b) or (I) independently of the raw material gas flow. In an embodiment, the hydrogen source gas flow may be reduced to zero at the end of step (c) or (II).

In still another aspect, the present invention provides a method for forming a silicon carbide film on a semiconductor substrate by plasma CVD, comprising the steps of: (A) introducing a raw material gas containing silicon, carbon, and hydrogen, a hydrogen source gas, and an inert gas at a predetermined mixing formulation of the raw material gas, the hydrogen source gas, and the inert gas, into a reaction chamber; (B) applying radio-frequency (RF) power to a reaction zone inside the reaction chamber at the mixture ratio, thereby forming on a semiconductor substrate a curable silicon carbide film; and (C) continuously applying radio-frequency power to the reaction zone at a mixing formulation wherein the hydrogen source gas flow is reduced from that in step (B), thereby curing the silicon carbide film to give a dielectric constant lower than that of the curable silicon carbide film. In the above, the RF power may preferably be comprised of low-frequency power and high-frequency power, and a ratio of the former to the latter may be less than about ½.

In yet another aspect, the present invention provides a method for forming an interconnect on a semiconductor substrate by plasma CVD, comprising the steps of: (1) forming a dielectric film on a semiconductor substrate using a gas containing silicon, carbon, oxygen, and hydrogen and optionally an inert gas by plasma CVD; (2) forming as an etch stop layer a silicon carbide film on the dielectric film according to any of the aforesaid methods; and (3) subjecting the substrate to etching for copper wiring. In the above, the dielectric film may be made of a Si—C—O—H material, and etch stop layer may be made of a Si—C—H material.

Further, the present invention includes a method for manufacturing on a semiconductor substrate an interlayer structure containing a film in contact with a copper layer, comprising the steps of: (i) forming multiple layers on a semiconductor substrate; (ii) forming a hole for an interlayer connection of the multiple layers by etching; (iii) depositing copper in the hole; (iv) removing an excess of the copper from a top of the multiple layers; (v) depositing a silicon carbide film on the top of the multiple layers according to any of the aforesaid methods, whereby the copper is covered by the silicon carbide film. In the above, in an embodiment, in step (i), the multiple layers may comprise a lower etch stop layer, a lower low dielectric layer, an intermediate etch stop layer, an upper low dielectric layer, and an upper etch stop layer laminated in sequence on the substrate, and in step (ii), the hole may be produced by forming a resist on top of the upper etch stop layer and forming a via hole and trench by etching the multiple layers using the resist, and in step (iv), the resist and the upper etch stop layer may be removed when removing the excess of the copper. The lower etch stop layer, the intermediate etch stop layer, and the upper etch stop layer may be formed according to any of the aforesaid methods.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

Figure 1:
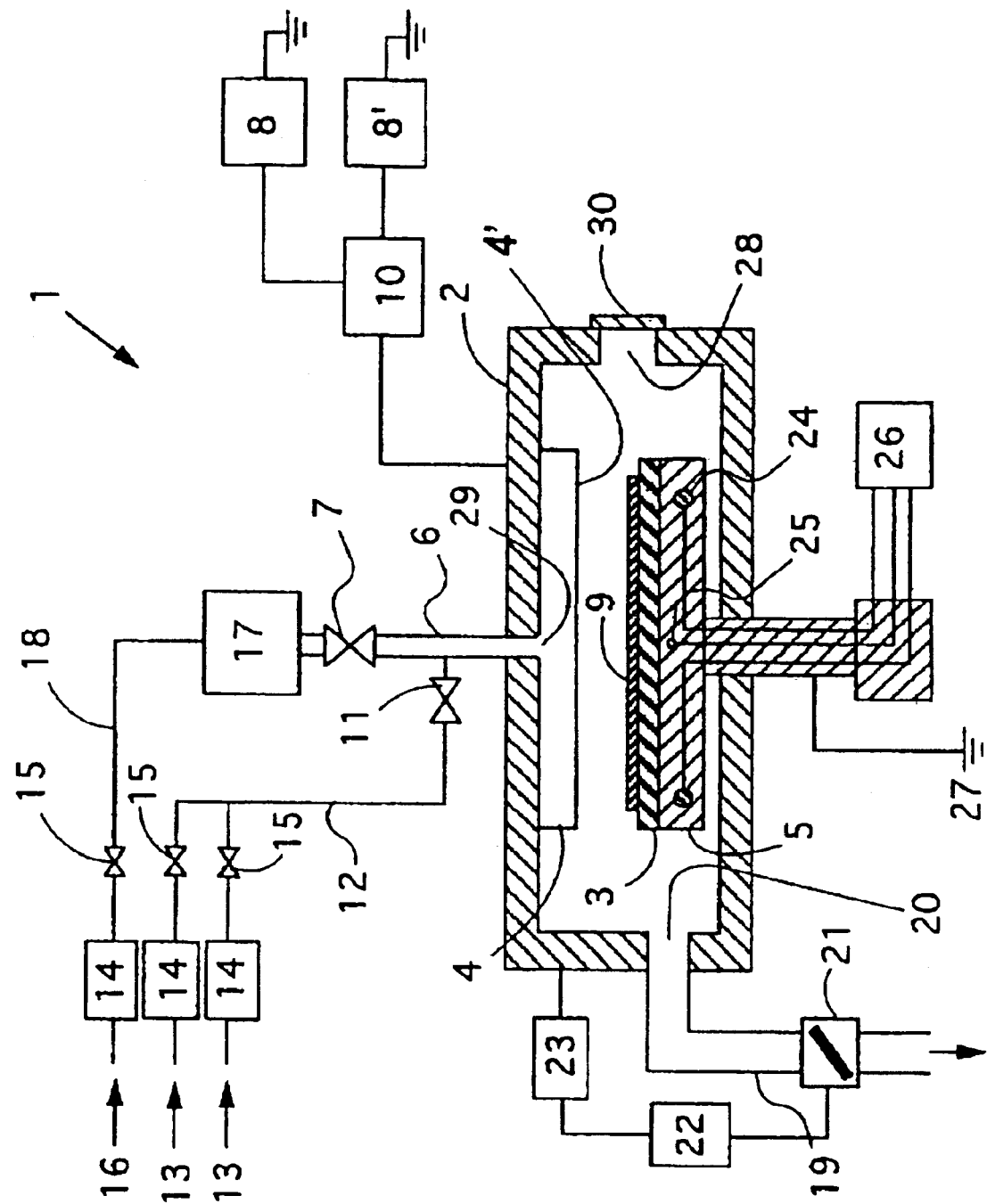
FIG. 1 is a schematic view showing a plasma CVD apparatus usable in the present invention.

Explanation of symbols used is as follows: 1: Plasma CVD equipment; 2: Reaction chamber; 3: Susceptor; 4: Showerhead; 5: Heater; 6: Piping; 7: Valve; 8, 8':Radio-frequency oscillators; 9: Semiconductor substrate; 10: Matching circuit; 11: Valve; 12: Piping; 13: Gas inlet port; 14: Mass flow controller; 15: Valve; 16: Gas inlet port; 17: Remote plasma chamber; 18: Piping; 19: Piping; 20: Exhaust port; 21: Conductance regulating valve; 22: Pressure controller; 23: Pressure gauge; 24: Sheath heater; 25: Thermocouple; 26: Temperature controller; 27: Ground; 28: Opening portion; 29: Gas inlet port; 30: Gate valve.

DETAILED DESCRIPTION OF THE PREFERRED EMBODIMENT

The present invention will be described in detail below with reference to preferred embodiments. However, the present invention simply includes these embodiments and should not be limited thereto.

The present invention is applied to various embodiments including, but not limited to, the following, wherein any steps, conditions, and materials used in an embodiment can be used interchangeably and complementarily in another embodiment without any restriction as long as the principle of operation can be maintained:

As described above, in an embodiment of the present invention, a method for forming a silicon carbide film on a semiconductor substrate by plasma CVD comprises the steps of: (a) introducing a raw material gas containing silicon, carbon, and hydrogen and an inert gas at a predetermined mixture ratio of the raw material gas to the inert gas into a reaction chamber; (b) applying radio-frequency power to a reaction zone inside the reaction chamber at the mixture ratio, thereby forming on a semiconductor substrate a curable silicon carbide film having a dielectric constant of about 4.0 or higher; and (c) continuously applying radio-frequency power to the reaction zone at a mixture ratio of the raw material gas to the inert gas which is reduced from that in step (b), thereby curing the silicon carbide film to give a dielectric constant lower than that of the curable silicon carbide film.

In the above, the cured silicon carbide film can be defined as a film having a stress change in the atmosphere or at 400° C. which is about less than 1/2 (including 1/3, 1/4, 1/5, and ranges including any of the forgoing) of that of the curable silicon carbide film. The curable silicon carbide film can be defined reversely.

In an embodiment, the reduction of the mixture ratio can be accomplished by (i) decreasing the flow rate of the raw material gas, (ii) increasing the flow rate of the inert gas, or (iii) both decreasing the flow rate of the raw material gas and increasing the flow rate of the inert gas. In an embodiment, the mixture ratio is constant before and after a point where the mixture ratio is discontinuously reduced. The change of the mixture ratio can be accomplished discontinuously, i.e., the mixture ratio can be vertically changed if the mixture ratio is the vertical axis and time is the horizontal axis (i.e., no transition period). alternatively, the change of the mixture ratio can be accomplished at a certain rate by a ramp-up/-down method (i.e., linear change) or at a variable rate in a continuous manner (e.g., logarithmic or exponential change). Although a discontinuous mixture ratio reduction is preferable, there are eight combinations with regard to mixture ratio reduction:

|   | Row Material Gas Flow   | Inert Gas Flow          |
|---|-------------------------|-------------------------|
| 1 | Constant                | Discontinuous Increase  |
| 2 | Constant                | Continuous Increase     |
| 3 | Discontinuous Reduction | Constant                |
| 4 | Discontinuous Reduction | Discontinuous Increase  |
| 5 | Discontinuous Reduction | Continuous Increase     |
| 6 | Continuous Reduction    | Constant                |
| 7 | Continuous Reduction    | Discontinuous Increase  |
| 8 | Continuous Reduction    | Continuous Increase     |

RF power may be applied to the reaction chamber continuously throughout the first and second steps. The other conditions can remain the same throughout the first and second steps. That is, in an embodiment, the second step can be conducted under film formation conditions without sufficient raw material gas supply for actual film formation.

In an embodiment, the mixture ratio of the raw material gas to the inert gas before the reduction (in the first step), is preferably about 1/1 to about 1/3 (including 1/2 and any values between the foregoing), although a range of 1/0.5–1/5 can be used in another embodiment.

In an embodiment, the mixture ratio of the raw material gas to the inert gas after the reduction (in the second step), is preferably about 1/5 to about 1/100, and in another embodiment, close to zero (including 1/10, 1/20, 1/30, 1/40, 1/50, 1/80, 1/200, 1/500, 1/1000, and any values between the foregoing). In another embodiment, the mixture ratio of the raw material gas to the inert gas after the reduction is about zero. Preferably, the flow of the inert gas continuously or discontinuously increases, whereas the flow rate of the raw material gas gradually decreases to zero (i.e., continuous reduction or give rate reduction). In the above, the mixture rate after the reduction means the final mixture rate in the second step.

The raw material gas may include, but is not limited to, organo-silane such as tetramethylsilane, trimethylsilane, and divinyl-dimethylsilane. The inert gas may include, but is not limited to, helium, argon, neon, xenon or krypton.

In an embodiment, the method may further comprise stabilizing the reaction zone prior to the film formation (before the first step), wherein the flow rate of the raw material gas and the flow rate of the inert gas are increased from zero until reaching a predetermined mixture ratio by a ramp-up method.

Further, the radio-frequency power may be comprised of low frequency power and high-frequency power. In an embodiment, low frequency power is power having a frequency of less than 2 MHz and high frequency power is power having a frequency of no less than 2 MHz. In another embodiment, the low-frequency power is applied in the range of about 10 W to about 600 W (including 50 W, 100 W, 200 W, 300 W, 400 W, 500 W, and any values between the foregoing), whereas the high-frequency power is applied in the range of about 100 W to about 2000 W (including 200 W, 500 W, 700 W, 1000 W, 1500 W, and any values between the foregoing), wherein the low-frequency power is lower than the high-frequency power.

In an embodiment, a time period for the curing (the second step) may be about 5 seconds to about 10 seconds per the curable silicon carbide film having a thickness of about 20 nm to about 100 nm. The time period may vary depending on the thickness of the film, the degree of completion of film formation reaction, etc. The time period per thickness of 10 nm may be about 0.5–5 seconds, including 1, 2, 3, 4, and any values between the foregoing. The thickness of the film is not limited to but may be in the range of 10–1000 nm depending on the intended purpose of the film.

The flow rate of the raw material gas and the flow rate of the inert gas before the reduction of the mixture ratio are about 100 sccm to about 1,000 sccm and about 100 sccm to about 3,000 sccm, respectively.

The silicon carbide film can be used as an etch stop layer, a hard film, a cap layer, or other films for various purposes.

In another aspect, the present invention provides a method for forming a silicon carbide film on a semiconductor substrate by plasma CVD, comprising the steps of: (I) forming a curable silicon carbide film having a dielectric constant of more than about 4.0 on a semiconductor substrate placed in a reaction chamber, by introducing a raw material gas containing silicon, carbon, and hydrogen at a given flow rate, and an inert gas at a given flow rate into the reaction chamber, and applying radio-frequency power to a reaction zone inside the reaction chamber; and (II) curing the silicon carbide film having a dielectric constant of no more than about 4.0 by discontinuously or continuously reducing and then maintaining a mixture ratio of the raw material gas to the inert gas while continuously applying radio-frequency power to the reaction zone.

In the above, the reduction of the mixture ratio may be accomplished by (i) decreasing the flow rate of the raw material gas, (ii) increasing the flow rate of the inert gas, or (iii) both decreasing the flow rate of the raw material gas and increasing the flow rate of the inert gas. Further, the mixture ratio may be constant before and after a point of the mixture ratio's discontinuous reduction. The silicon carbide film may be an etch stop film.

In another embodiment, in the first step, in addition to the raw material gas and the inert gas, another additive gas such as a hydrogen source gas may be introduced into the reaction chamber, depending on the type of target silicon carbide film. By adding a hydrogen source gas, the resulting silicon carbide film can have a low dielectric constant with low leakage current and compressive stress. The leakage current and dielectric constant in the resulting silicon carbide film are directly related to the carbon concentration in the film, and the amount of raw material gas such as tetra-methylsilane and inert gas introduced into the reaction chamber. In an embodiment, the carbon concentration in the silicon carbide film may be controlled in the range of about 15 to about 30 atomic % (preferably about 20 to about 25 atomic %) by controlling the hydrogen source gas flow so as to specifically reduce the leakage current.

In the above, the hydrogen source gas flow can be changed in the second step by synchronizing the hydrogen source gas flow with the raw material gas flow or by reducing the hydrogen source gas from that in the first step independently of the raw material gas flow. In an embodiment, the hydrogen source gas flow may be reduced to about zero at the end of the second step.

In an aspect where a hydrogen source gas is used, a method for forming a silicon carbide film on a semiconductor substrate by plasma CVD, comprises the steps of: (A) introducing a raw material gas containing silicon, carbon, and hydrogen, a hydrogen source gas, and an inert gas at a predetermined mixing formulation of the raw material gas, the hydrogen source gas, and the inert gas, into a reaction chamber; (B) applying radio-frequency power to a reaction zone inside the reaction chamber at the mixture ratio, thereby forming on a semiconductor substrate a curable silicon carbide film; and (C) continuously applying radio-frequency power to the reaction zone at a mixing formulation wherein the hydrogen source gas flow is reduced from that in step (B), thereby curing the silicon carbide film to give a dielectric constant lower than that of the curable silicon carbide film. In the above method, the hydrogen source gas flow can be changed in step (C) (the second step) by synchronizing the flow with the raw material gas flow or independently controlling the flow as follows:

| | Row Material Gas Flow | Hydrogen Source Gas | Inert Gas Flow |
|---|---|---|---|
| 9 | Constant | Continuous Reduction | Discontinuous Increase |
| 10 | Constant | Continuous Reduction | Continuous Increase |
| 11 | Constant | Discontinuous Reduction | Discontinuous Increase |
| 12 | Constant | Discontinuous Reduction | Continuous Increase |
| 13 | Discontinuous Reduction | Continuous Reduction | Constant |
| 14 | Discontinuous Reduction | Discontinuous Reduction | Constant |
| 15 | Discontinuous Reduction | Continuous Reduction | Discontinuous Increase |
| 16 | Discontinuous Reduction | Discontinuous Reduction | Discontinuous Increase |
| 17 | Discontinuous Reduction | Continuous Reduction | Continuous Increase |
| 18 | Discontinuous Reduction | Discontinuous Reduction | Continuous Increase |
| 19 | Continuous Reduction | Continuous Reduction | Constant |
| 20 | Continuous Reduction | Discontinuous Reduction | Constant |
| 21 | Continuous Reduction | Continuous Reduction | Discontinuous Increase |
| 22 | Continuous Reduction | Discontinuous Reduction | Discontinuous Increase |
| 23 | Continuous Reduction | Continuous Reduction | Continuous Increase |
| 24 | Continuous Reduction | Discontinuous Reduction | Continuous Increase |

In an embodiment, the hydrogen source gas flow may be about 10 sccm to about 5,000 sccm (including 20, 30, 50, 100, 200, 300, 500, 1,000, 2,000, 3,000 sccm, and any values between the foregoing, preferably about 20 sccm to about 1,000 sccm, more preferably about 20 sccm to about 500 sccm) in the first step, and about 0 sccm to about 1,000 sccm (including 10, 20, 30, 50, 100, 250, 500, 750, and any values between the foregoing, preferably about 0 sccm to about 500 sccm, more preferably about 0 sccm to about 250 sccm, further preferably about 0 sccm to about 30 sccm) in the second step, wherein the flow in the second step is less than that in the first step. In an embodiment, the hydrogen source gas flow may be about 10% to about 100% (including 20%, 30%, 50%, and any values between the foregoing) of the raw material gas flow.

The hydrogen source gas includes, but are not limited to, a hydrogen gas and a carbohydrate gas such as methane and ethane. When using a hydrogen source gas other than a hydrogen gas, the flow may be determined based on the hydrogen content.

The conditions applied to plasma CVD without the hydrogen source gas can be applied to plasma CVD using the hydrogen source gas. For example, the radio-frequency power may be comprised of low frequency power and high-frequency power. The low frequency power may be less than about 50% (including 1%, 5%, 10%, 20%, 30%, 40%, and any values between the foregoing) of the total power. The second step may be conducted for about 5 seconds to about 10 seconds, depending on the type of silicon carbide film and its thickness. In an embodiment, the duration of the second step may be in the range of about 1 second to about 50 seconds (including 5, 10, 20, 30 seconds, and any values between the foregoing) for the duration of the first step of about 10 seconds to about 100 seconds (including 20, 30, 60, 80 seconds, and any values between the foregoing), wherein the second step is shorter than the first step.

The following conditions can be used for plasma CVD without hydrogen source gas but may be suitable for plasma CVD using hydrogen source gas, although the present invention should not be limited thereto:

(1) High-frequency RF power has a frequency between about 13 MHz and about 30 MHz and has a power between about 200 watts and about 1000 watts, and the low frequency RF power has a frequency between about 100 kHz and about 500 kHz and has a power between about 50 watts and 500 watts.
(2) A ratio of the low frequency RF power to a total RF power is less than about 0.5.
(3) The average power at an electrode surface is substantially constant.
(4) The silicon and carbon source gas (raw material gas) is one of the following: tri-methylsilane, tetra-methylsilane, or divinyl-dimethylsilane.
(5) The inert gas is one of the following: helium, argon, or krypton.
(6) The hydrogen source is either one of the following or both: Methane ($CH_4$) or hydrogen ($H_2$).
(7) The ratio of the silicon and carbon source gas to the inert gas in the first step is between about 1:1 and about 1:15.
(8) The silicon and carbon source gas is provided into the reaction zone at a rate between about 200 sccm and about 500 sccm.
(9) The substrate is heated to a temperature between about 200° C. and about 400° C.
(10) The substrate is heated to a temperature between about 320° C. and about 350° C.
(11) The reaction zone is maintained at a pressure between about 300 Pa and about 1000 Pa.
(12) The reaction zone is maintained at a pressure between about 500 Pa and about 800 Pa.
(13) The silicon carbide film formation compromises the steps of: i) a basic film formation step (first step), where the basic film is formed on the substrate by flowing TMS, $H_2$, He and applying RF power; and ii) an active plasma treatment step (second step), where after the basic film formation step, the second film formation step is carried out continuously, in which He flow is increased while TMS and $H_2$ flow is decreased without changing plasma discharge.
(14) The film formation continues during the active plasma treatment step.
(15) He is used as the inert gas, and its flow during the active plasma treatment step is increased to a rate of about 1500 sccm to 3000 sccm.
(16) $H_2$ gas is used as the hydrogen source gas, and its flow rate during the active plasma treatment step is decreased to a rate of about 30 sccm to 0 sccm.
(17) TMS (tetra-methylsilane) is used as the raw material gas, and its flow rate during the active plasma step is decreased to a rate of about 100sccm to 0sccm.
(18) He, TMS, and $H_2$ are used, and during the active plasma treatment, their flows are increased, decreased, and decreased, respectively, without changing the plasma discharge.
(19) The duration period of the second step which is stated here as the active plasma treatment step is between from 5 seconds to 10 seconds.
(20) A ratio of the low frequency RF power to the total power during the active plasma treatment step is substantially the same as that during the basic film forming step which is less than that of 0.5.
(21) The pressure during the active plasma treatment step is substantially the same as that during the basic film forming step which is maintained at a pressure between 500 Pa to about 800 Pa.
(22) The silicon carbide layer has a dielectric constant less than about 4.0.
(23) The silicon carbide layer has a compressive film stress.
(24) The silicon carbide layer has a leakage current of less than $1 \times 10^{-9} A/cm^2$ at an electric field of 1 MV/cm.
(25) The silicon carbide film is an etch stop layer.
(26) The silicon carbide film is a hard mask.

The present invention is not limited to the aforesaid methods and includes another aspect which is a method for forming an interconnect on a semiconductor substrate by plasma CVD, comprising the steps of: (a) forming a dielectric film on a semiconductor substrate using a gas containing silicon, carbon, oxygen, and hydrogen and optionally an inert gas by plasma CVD; (b) forming as an etch stop layer a silicon carbide film on the dielectric film according to any of the aforesaid methods; and (c) subjecting the substrate to etching for copper wiring. In the above, the dielectric film may be made of a Si—C—O—H material, and etch stop layer may be made of a Si—C—H material.

Further, in another aspect of the present invention, a method for manufacturing on a semiconductor substrate an interlayer structure containing a film in contact with a copper layer, comprises the steps of: (i) forming multiple layers on a semiconductor substrate; (ii) forming a hole for an interlayer connection of the multiple layers by etching; (iii) depositing copper in the hole; (iv) removing an excess of the copper from a top of the multiple layers; (v) depositing a silicon carbide film on the top of the multiple layers according to any of the foregoing methods, whereby the copper is covered by the silicon carbide film.

In an embodiment, in step (i), the multiple layers comprise a lower etch stop layer, a lower low dielectric layer, an intermediate etch stop layer, an upper low dielectric layer, and an upper etch stop layer laminated in sequence on the substrate, and in step (ii), the hole is produced by forming a resist on top of the upper etch stop layer and forming a via hole and trench by etching the multiple layers using the resist, and in step (iv), the resist and the upper etch stop layer are removed when removing the excess of the copper. In the above, the lower etch stop layer, the intermediate etch stop layer, and the upper etch stop layer may be formed according to any of the foregoing methods. In an embodiment, steps (i) through (iv) above may be repeated at least once until the desired or intended interlayer connection structures are formed.

The main characteristics of etch stop layers and copper diffusion barrier layers such as silicon carbide films (SiC) developed using various embodiments of the present invention may be as follows in an embodiment:

a) The dielectric constant is less than 4.0.
b) The film stress is compressive.
c) No changes of its film properties such as changes of the film stress or changes of film dielectric constant are observed even when directly exposed to the air at a temperature between 20° C. to 30° C.
d) The leakage current at 1 MV/cm is extremely low, such as less than $1 \times 10^{-9}$ A/cm$^2$.
e) The etch selectivity of SiC against SiOC (as intermediate dielectric) is higher than 5.

According to one preferred embodiment of the present invention using a hydrogen source gas, a method of forming low dielectric constant, low leakage current with compressive stress silicon carbide film for use in integrated circuit fabrication processes can be provided. The silicon carbide film can be deposited on a substrate by introducing alkyl silicon compounds such as divinyl-dimethylsilane (Si(CH=CH$_2$)$_2$(CH$_3$)$_2$), tri-methylsilane (SiH(CH$_3$)$_3$), and tetra-methylsilane (Si(CH$_3$)$_4$) referred to herein as TMS, a substantial source of hydrogen such as hydrogen gas (H$_2$) and methane, and an inert gas such as argon (Ar), helium (He), krypton (Kr), neon (Ne), and xenon (Xe) in the presence of an electric field in a plasma CVD reactor.

A mixture of high and low frequency RF power generates the electric filed, wherein high frequency RF power may be in the range of 13.56 MHz to 30 MHz and low frequency RF power may be in the range of 200 kHz to 500 kHz, and wherein the ratio of low frequency to the total power is less than about 0.5. The leakage current and dielectric constant of the silicon carbide in this invention may be decreased by introducing excess amount of tetra-methylsilane and inert gas.

As described above, the present invention includes various embodiments and aspects and can be used in various ways.

The present invention is described further in detail with referent to the drawings. FIG. 1 shows a schematic view of plasma CVD equipment used for the method of depositing a silicon carbide film on a semiconductor substrate according to an embodiment of the present invention. A plasma CVD apparatus (plasma enhanced CVD, PECVD) 1 comprises a reaction chamber 2, a susceptor 3 provided inside the reaction chamber and used for holding a semiconductor substrate thereon and a showerhead 4 set up opposing to a susceptor 3 and used for emitting a jet of reaction gases equally to a semiconductor substrate 9.

On a sidewall of the reaction chamber 2, an exhaust port 20 used for evacuating the reaction chamber 2 is provided, which is connected to a vacuum pump (not shown) via piping 19. Between the exhaust port 20 and the vacuum pump, a conductance regulating valve 21 for regulating a pressure inside the reaction chamber 2 is set up. The conductance regulating valve 21 is electrically connected to a pressure gauge 23 for measuring a pressure inside the reaction chamber via a pressure controller 22.

Additionally, on the sidewall of the reaction chamber 2, an opening portion 28 is provided. The opening portion 28 is connected to a handling chamber (not shown) for bringing/carrying out the semiconductor substrate 9 via a gate valve 30 into/from the reaction chamber 2.

Below the susceptor 3, an aluminum alloy heater 5 for heating the semiconductor substrate 9 is provided. Inside the aluminum alloy heater 5, a resistance heating type sheath heater 24 and a thermocouple 25 are embedded and are connected to a temperature controller 26 for controlling a temperature of the semiconductor substrate 9 at a given temperature. The susceptor 3 and the aluminum alloy heater 5 are grounded 27 to form one electrode for plasma discharge. In place of the susceptor 3 and the aluminum alloy heater 5, a ceramic heater can also be used. In this regard, the ceramic heater can also be used as a susceptor so as to hold the semiconductor substrate directly. The ceramic heater comprises a ceramic base produced by integrating a resistance heating type heater into the base by sintering. As a material of the ceramic base, a ceramic nitride or oxide resistant to fluoric or chloric activated species can be used. Preferably, the ceramic base comprises aluminum nitride, but can comprise aluminum oxide or magnesium oxide.

Inside the reaction chamber 2, the showerhead 4 is set up at a position opposing to the susceptor 3. In an undersurface 4' of the showerhead 4, about 1,000 to about 5,000 fine pores (not shown) with a diameter of about 0.5 mm to about 1.0 mm for emitting a jet of a gas evenly to the semiconductor substrate 9 are provided. The showerhead 4 is electrically connected to radio-frequency oscillators (8, 8') preferably via a matching circuit 10 and serves as the other electrode for plasma discharge. Here, by connecting the radio-frequency oscillators to the susceptor 3, grounding the showerhead 4 can be achieved. The radio-frequency oscillators (8, 8') respectively generate two different types of radio-frequency power 13 MHz or higher (normally in industrial practice, 13.56 MHz or 27.12 MHz) and 100 kHz to 1 MHz (preferably 300 kHz to 400 kHz). These two types of radio-frequency power are synthesized inside the matching circuit 10 and are supplied to the showerhead 4. Reaction gases (gases comprising a raw material gas and an inert gas) supplied to a reaction space over the semiconductor substrate 9 from the showerhead 4 are excited and decomposed by plasma discharge formed by radio-frequency power applied to the showerhead 4 and deposit a thin film on the semiconductor substrate 9.

In nearly the center of the upper surface of the showerhead 4, a gas inlet port 29 is provided. Piping 6 is connected to the gas inlet port 29. Upstream of the piping 6, a remote plasma chamber 17 is connected via a valve 7. Piping 18 is further connected to the remote plasma chamber 17. Upstream of the piping 18, a valve 15 and a mass flow controller 14 are connected. The end of the piping 18 is formed as a cleaning gas inlet port 16. According to the type of cleaning gas, the number of gas inlet ports 16 is determined. Fed from the gas inlet port 16 with its flow rate controlled by the mass flow controller 14 at a given flow rate, a cleaning gas is activated in the remote plasma chamber 17 to clean inside the reaction chamber 2.

Piping 12 is connected in a position between the gas inlet port 29 of the piping 6 and the valve 7 via a valve 11. Upstream of the piping 12, the valve 15 and the mass flow controller 14 are connected. The end of the piping 12 is formed as raw material gas inlet ports 13. According to types of reaction gases, the number of gas inlet ports 13 is determined. Fed from the gas inlet ports 13 with their respective flow rates controlled by the mass flow controller 14 at a given flow rate, various gases are mixed while flowing through the piping 12 and the piping 6 and are supplied to the showerhead 4 via the gas inlet port 29.

In another preferred embodiment of the present invention, a silicon carbide layer is formed by reacting a gas mixture including, silicon source, carbon source, hydrogen source and an inert gas into a plasma enhanced chemical vapor deposition (PECVD) chamber. Details of the processing system are illustrated in FIG. 1.

In an embodiment, plasma CVD using a hydrogen source gas may use, but should not be limited to, the following conditions (except for the use of a hydrogen source gas, the conditions and materials described below can be used in plasma CVD without a hydrogen source gas, and vice versa):

A silicon and carbon source (raw material gas) may be an alkyl silicon compound having a general formula $Si_xC_yH_z$, where x is an integer of 1 to 2, y is an integer of 1 to 6, and z is an integer of 6 to 20. For example, divinyl-dimethylsilane, tri-methylsilane, and/or tetra-methylsilane among others maybe used as the alkyl silicon compound. A hydrogen source may be tetra-methylsilane (TMS) and/or hydrogen gas ($H_2$). Helium (He), argon (Ar), neon (Ne), krypton (Kr), and/or xenon (Xe) may be used as the inert gas.

In general, the deposition process parameters of forming a silicon carbide film on a 200 mm silicon wafer include a substrate temperature range of about 200° C. to about 400° C. (more preferably 300° C. to 380° C.), a chamber pressure of about 300 Pa to about 1,000 Pa, an alkyl silicon compound flow rate of about 100 sccm to about 1,000 sccm, the hydrogen source flow rate of about 10 sccm to 1,000 sccm, and an inert gas flow rate of about 200 sccm to 5,000 sccm. This creates a ratio of the inert gas flow rate to alkyl silicon compound is in the range of about 1:1 to about 1:10. The process also includes a mixed frequency RF power having at least a first RF power with a frequency in a range of about 13 MHz to 30 MHz (high frequency) with a power in a range of about 100 Watts to 2,000 Watts; and at least a second RF power with a frequency in a range of about 100 kHz to 500 kHz (low frequency) with a power in the range of about 50 Watts to 500 Watts. Thus the ratio of low frequency to total power is less than about 0.5, and the RF power source generates the electric field. Preferably the first RF power is in the range of about 300 W to about 1,000 W and the second RF power is in the range of 50 W to 250 W. The second RF power with a frequency in a range of about 300 kHz to about 450 kHz is preferably used in combination with the first RF power.

The ratio of the second RF power to the total mixed frequency power is preferably less than about 0.5 to 1.0. The above process parameters provide a deposition rate for the silicon carbide layer in the range of about 100 nm/min to about 350 nm/min, when implemented on a 200mm substrate in a deposition chamber.

The silicon carbide film forming steps and parameters are explained in detail below.

As an exemplary process for growing silicon carbide film on a substrate according to the present invention, the parameters listed in Tables 1 through 3 may be used:

TABLE 1

| Parameter | Step 1 | Step 2 |
|---|---|---|
| Tetra-methylsilane (TMS) flow rate | 100 sccm–1000 sccm | 0 sccm–500 sccm |
| Helium (He) flow rate | 100 sccm–10000 sccm | 100 sccm–10000 sccm |
| Hydrogen ($H_2$) flow rate | 10 sccm–5000 sccm | 0 sccm–1000 sccm |
| Pressure | 300 Pa–1000 Pa | 300 Pa–1000 Pa |
| Primary RF Power | 100 W–2000 W | 100 W–2000 W |
| Secondary RF Power | 10 W–500 W | 10 W–500 W |
| Substrate Temperature | 200° C.–400° C. | 200° C.–400° C. |

TABLE 2

| Parameter | Step 1 | Step 2 |
|---|---|---|
| Tetra-methylsilane (TMS) flow rate | 100 sccm–700 sccm | 0 sccm–300 sccm |
| Helium (He) flow rate | 100 sccm–3000 sccm | 100 sccm–5000 sccm |
| Hydrogen ($H_2$) flow rate | 20 sccm–1000 sccm | 0 sccm–500 sccm |
| Pressure | 300 Pa–1000 Pa | 300 Pa–1000 Pa |
| Primary RF Power | 100 W–1000 W | 100 W–1000 W |
| Secondary RF Power | 20 W–300 W | 20 W–300 W |
| Substrate Temperature | 250° C.–350° C. | 250° C.–350° C. |

TABLE 3

| Parameter | Step 1 | Step 2 |
|---|---|---|
| Tetra-methylsilane (TMS) flow rate | 100 sccm–500 sccm | 0 sccm–100 sccm |
| Helium (He) flow rate | 100 sccm–1000 sccm | 100 sccm–2500 scmm |
| Hydrogen ($H_2$) flow rate | 20 sccm–500 sccm | 0 sccm–250 sccm |
| Pressure | 300 Pa–800 Pa | 300 Pa–800 Pa |

TABLE 3-continued

| Parameter | Step 1 | Step 2 |
|---|---|---|
| Primary RF Power | 350 W–500 W | 350 W–500 W |
| Secondary RF Power | 50 W–150 W | 50 W–150 W |
| Substrate Temperature | 300° C.–350° C. | 300° C.–350° C. |

Figure 2:
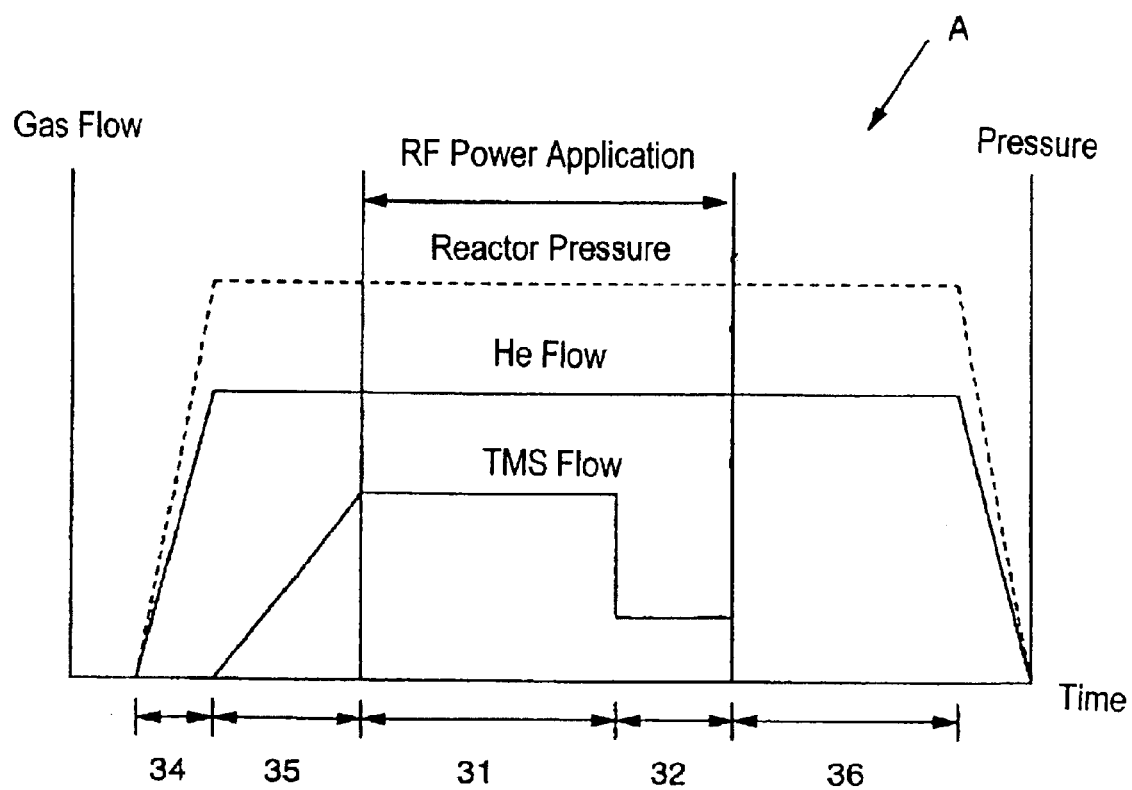
FIG. 2 is a diagram showing film formation control sequences (Sequence A) used for manufacturing a silicon carbide film according to an embodiment of the present invention.

The method of manufacturing a silicon carbide film on the semiconductor substrate according to an embodiment of the present invention is described below. FIG. 2 shows a preferred embodiment of a deposition control sequence used in the method of manufacturing the silicon carbide film according to the present invention. The Sequence A comprises reaction gas introduction steps (34, 35), deposition steps (31, 32) and a purge step 36.

The reaction gas introduction steps comprise an inert gas introduction step 34 and a raw material gas introduction step 35. After a semiconductor substrate 9 is brought inside the reaction chamber 2 and is heated at a given temperature (preferably at about 300° C. to about 400° C., more preferably at about 320° C. to about 350° C.), an inert gas (preferably, helium) whose flow rate is controlled within the range of about 100 sccm to about 3,000 sccm is brought into the reaction chamber 2 in the inert gas introduction step 34. In place of helium, argon, neon, xenon or krypton can be used as an inert gas. By using argon or a mixture gas of argon and helium as an inert gas, a film having high film stress and high film density can be formed. With the inert gas brought in, a pressure inside the reaction chamber 2 is regulated at a determined value within the range of about 100 Pa to about 1000 Pa (preferably, about 400 Pa to about 700 Pa). Subsequently, in the raw material gas introduction step 35, a raw material gas (preferably, tetramethylsilane (Si(CH$_3$)$_4$)) whose flow rate is controlled within the range of about 100 sccm to about 1,000 sccm is brought into the reaction chamber 2. Here, as a raw material gas, trimethylsilane can also be used. In the reaction gas introduction step, a ratio of an inert gas to a raw material gas brought in is preferably about 1 to about 3. When the reaction gases are brought into the reaction chamber, a method of ramping up a flow rate from zero to a prescribed value during designed period of time is adopted. This is to prevent particles from floating due to a pressure rise inside the reaction chamber caused by sudden gas inflow and consequently adhering to the semiconductor substrate 9.

Succeeding deposition steps comprise the first deposition step 31 and the second deposition step 32. A ratio of reaction gases in the first deposition step is preferably about 200 sccm to about 500 sccm of tetramethylsilane to about 300 sccm to about 1500 sccm of He; more preferably about 200 sccm to about 500 sccm of tetramethylsilane to about 300 sccm to about 600 sccm of He. After stabilization of a reaction gas flow rate and a pressure inside the reaction chamber has been confirmed, two types of radio-frequency power of 27.12 MHz and 400 kHz are applied within the range at about 200 W to about 1,000 W and at about 50 W to about 500 W respectively (preferably at about 300 W to about 600 W and at about 100 W to about 300 W respectively) to the showerhead 4. Using radio-frequency power of 27.12 MHZ has effect to reduce plasma damage and electrostatic charge caused by plasma to the semiconductor substrate 9. 13.56 MHz can be used as a frequency of relatively higher radio-frequency power. The execution time of the first deposition step 31 is determined based on the time calculated from a targeted film thickness of a silicon carbide film and a deposition rate (preferably, about 100 nm/min to about 200 nm/min). In the first deposition step 31, a silicon carbide base film having a dielectric constant of about 4.0 to about 4.2 is formed on the semiconductor substrate 9. Although this silicon carbide base film has a lower dielectric constant than conventional silicon carbide films, its film characteristics are changed by absorbing moisture or oxygen or reacting to them if it is left as it is because its film-formation reaction is unfinished. Consequently, after pursuing research work earnestly, the inventors of the present invention found a method to solve these problems by executing the second deposition step described below subsequently to the first deposition step.

The second deposition step 32 is executed subsequently to the first deposition step 31. In the second deposition step 32, the radio-frequency power and a reaction chamber pressure applied are the same as in the first deposition step. In the second deposition step 32, while a flow rate of He is kept at a fixed flow, only a flow rate of tetramethylsilane is decreased discontinuously up to the range of about 20 sccm to about 600 sccm. In the second deposition step 32, a flow ratio of He to tetramethylsilane is about 5 or more (preferably from about 5 to about 15). The execution time of the second deposition step 32 is at least about 3 seconds; for a film thickness from about 20 nm to about 100 nm (in some cases, about 30 nm to about 100 nm) which is a typically requested film thickness of a silicon carbide film, the execution time is preferably from about 5 seconds to about 10 seconds. Thus, by executing a deposition reaction by changing a mixture ratio of reaction gases in the second deposition step 32, the reaction of the silicon carbide base film formed in the first deposition step 31 has been carried through and change of film characteristics over time is stopped.

After the second deposition 32 is completed, application of the radio-frequency power to the showerhead 4 is stopped in the purge step 36 and at the same time feeding of tetramethylsilane is also stopped. He gas is continuously fed into the reaction chamber 2 and remaining tetramethylsilane or its decomposition products' volatile components are evacuated outside the reaction chamber.

Figure 3:
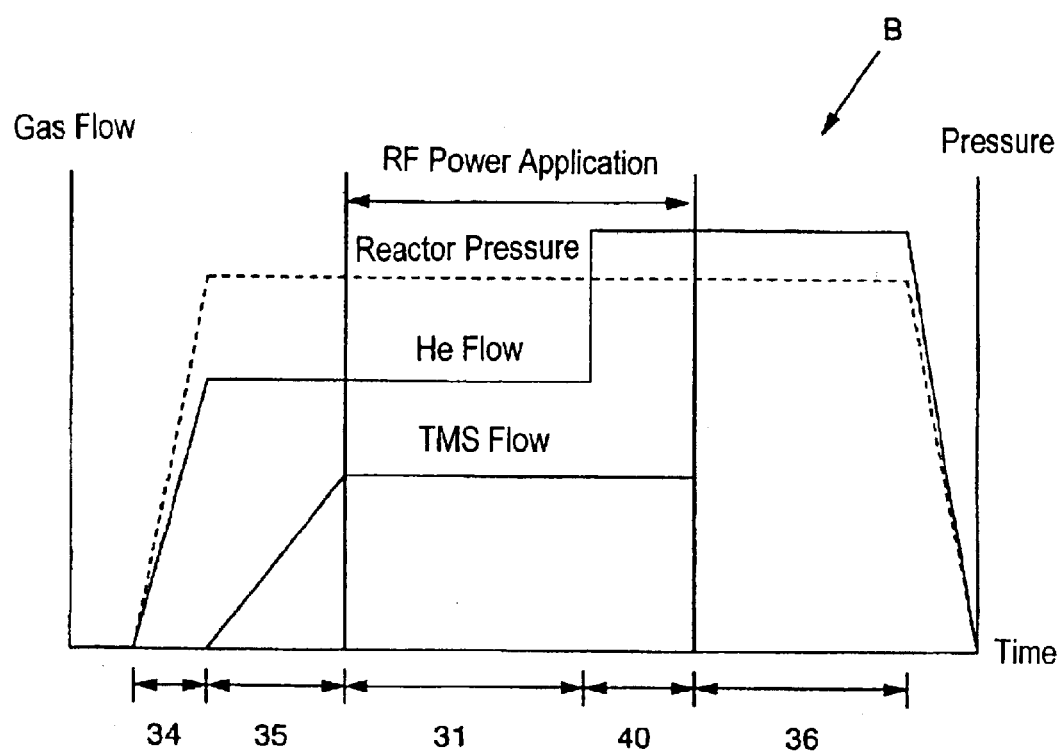
FIG. 3 is a diagram showing film formation control sequences (Sequence B) used for manufacturing a silicon carbide film according to another embodiment of the present invention.

FIG. 3 shows another embodiment of a deposition sequence used in the method of manufacturing the silicon carbide film according to the present invention. The Sequence B comprises reaction gas introduction steps (34, 35), deposition steps (31, 40) and a purge step 36. Because the reaction gas introduction steps and the purge step are the same as in the Deposition Sequence A shown in FIG. 2, descriptions are omitted. The deposition step of the Deposition Sequence B shown in FIG. 3 comprises the first deposition step 31 and the second deposition step 40. The first deposition step 31 is the same as the first deposition step 31 of the Deposition Sequence A. As for the Deposition Sequence B, in the second deposition step 40, while a flow rate of tetramethylsilane is kept at a fixed flow, by increasing only a flow rate of He discontinuously, a mixture ratio of the reaction gases is changed. Specifically, in the first deposition step 31, a mixture ratio of the reaction gases is about 100 sccm to about 1,000 sccm of tetramethylsilane to about 100 sccm to 3,000 sccm of He; in the second deposition step 40, a mixture ratio is about 100 sccm to about 1,000 sccm of tetramethylsilane to about 500 sccm to about 10,000 sccm of He. Preferably, in the first deposition step 31, a mixture ratio of the reaction gases is about 200 sccm to about 500 sccm of tetramethylsilane to about 300 sccm to about 1,500 sccm of He; in the second deposition step 40, a mixture ratio is about 200 sccm to about 500 sccm of tetramethylsilane to about 1,000 sccm to about 5,000 sccm of He. More preferably, in the first deposition step 31, a mixture ratio of the reaction gases is about 200 sccm to about 500 sccm of tetramethylsilane to about 300 sccm to about 600 sccm of He; in the second deposition step 40, a mixture ratio is about 200 sccm to about 500 sccm of tetramethylsilane to about 1,500 sccm to about 3,000 sccm of He. In the second deposition step 40, a flow ratio of He to tetramethylsilane is about 5 or more (preferably from about 5 to about 10).

Figure 4:
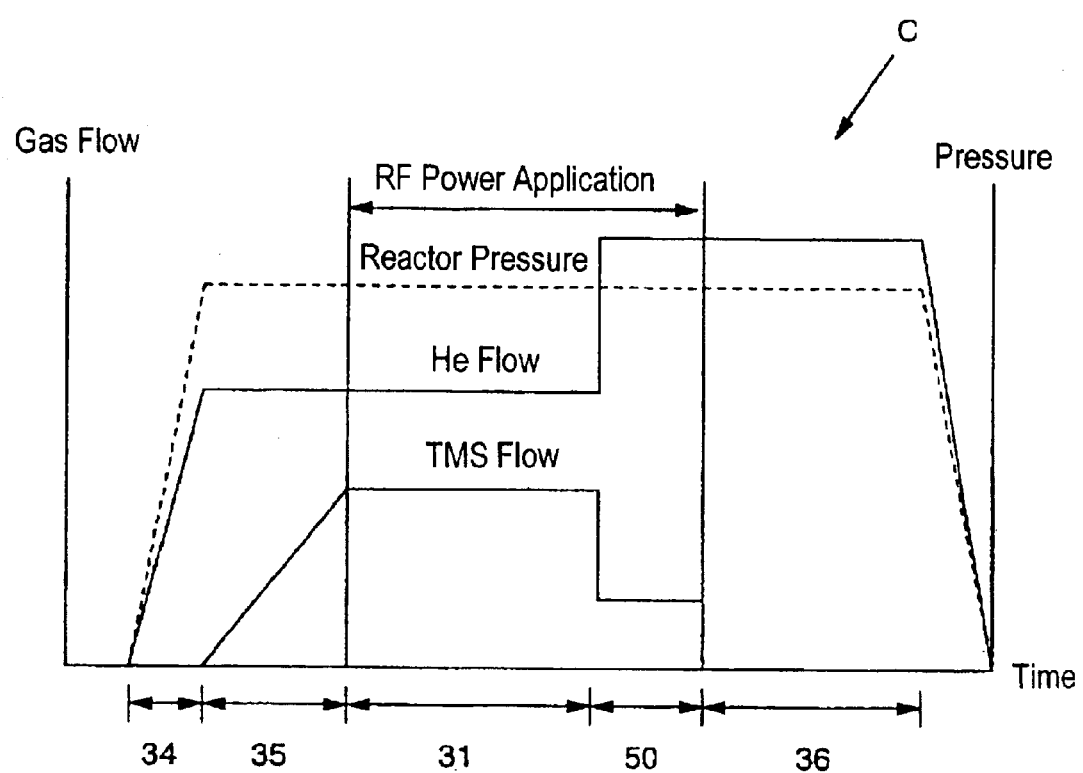
FIG. 4 is a diagram showing film formation control sequences (Sequence C) used for manufacturing a silicon carbide film according to another embodiment of the present invention.

FIG. 4 shows a third embodiment of a deposition sequence used in the method of manufacturing the silicon carbide film according to the present invention. The Deposition Sequence C comprises reaction gas introduction steps (34, 35), deposition steps (31, 50) and a purge step 36. Because the reaction gas introduction steps and the purge step are the same as in the Deposition Sequence A shown in FIG. 2, descriptions are omitted. The deposition step of the Deposition Sequence C shown in FIG. 4 comprises the first deposition step 31 and the second deposition step 50. The first deposition step 31 is the same as the first deposition step 31 of the Deposition Sequence A. As for the Deposition Sequence C, in the second deposition step 50, by decreasing a flow rate of tetramethylsilane discontinuously and at the same time increasing a flow rate of He discontinuously, a mixture ratio of the reaction gases is changed. Specifically, in the first deposition step 31, a mixture ratio of the reaction gases is about 100 sccm to about 1,000 sccm of tetramethylsilane to about 100 sccm to about 3,000 sccm of He; in the second deposition step 50, a mixture ratio is about 20 sccm to about 600 sccm of tetramethylsilane to about 500 sccm to about 10,000 sccm of He. Preferably, in the first deposition step 31, a mixture ratio of the reaction gases is about 200 sccm to about 500 sccm of tetramethylsilane to about 300 sccm to about 1,500 sccm of He; in the second deposition step 50, a mixture ratio is about 30 sccm to about 100 sccm of tetramethylsilane to about 1,000 sccm to about 5,000 sccm of He. More preferably, in the first deposition step 31, a mixture ratio of the reaction gases is about 200 sccm to about 500 sccm of tetramethylsilane to about 300 sccm to about 600 sccm of He; in the second deposition step 50, a mixture ratio is about 30 sccm to about 50 sccm of tetramethylsilane to about 1,500 sccm to about 3,000 sccm of He. In the second deposition step 50, a flow ratio of He to tetramethylsilane is about 16 or more (preferably from about 30 to about 60).

Figure 5:
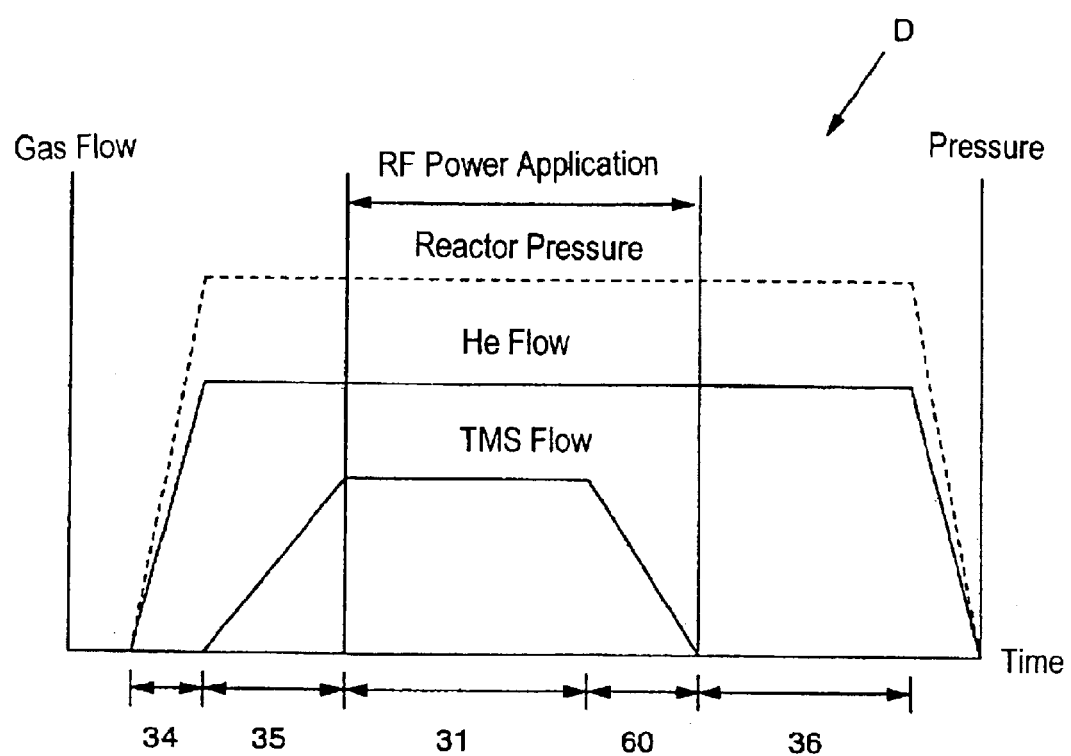
FIG. 5 is a diagram showing film formation control sequences (Sequence D) used for manufacturing a silicon carbide film according to another embodiment of the present invention.

FIG. 5 shows a fourth embodiment of a deposition sequence used in the method of manufacturing the silicon carbide film according to the present invention. The Deposition Sequence D comprises reaction gas introduction steps (34, 35), deposition steps (31, 60) and a purge step 36. Because the reaction gas introduction steps and the purge step are the same as in the Deposition Sequence A shown in FIG. 2, descriptions are omitted. The deposition step of the Deposition Sequence D shown in FIG. 5 comprises the first deposition step 31 and the second deposition step 60. The first deposition step 31 is the same as the first deposition step 31 of the Deposition Sequence A. As for the Deposition Sequence D, in the second deposition step 60, while a flow rate of He is kept at a fixed flow, by decreasing only a flow rate of tetramethylsilane at a prescribed speed continuously to zero, a mixture ratio of the reaction gases is changed. Specifically, in the first deposition step 31, a mixture ratio of the reaction gases is about 100 sccm to about 1,000 sccm of tetramethylsilane to about 100 sccm to about 3,000 sccm of He; in the second deposition step 60, while a flow rate of He is kept at a fixed flow, a flow rate of tetramethylsilane is decreased to zero. Preferably, in the first deposition step 31, a mixture ratio of the reaction gases is about 200 sccm to about 500 sccm of tetramethylsilane to about 300 sccm to about 1,500 sccm of He; in the second deposition step 60, while a flow rate of He is kept at a fixed flow, a flow rate of tetramethylsilane is decreased to zero. More preferably, in the first deposition step 31, a mixture ratio of the reaction gases is about 200 sccm to about 500 sccm of tetramethylsilane to about 300 sccm to about 600 sccm of He; in the second deposition step 60, while a flow rate of He is kept at a fixed flow, a flow rate of tetramethylsilane is decreased to zero. In the second deposition step 60, a flow decrease rate of tetramethylsilane is determined by the execution time (at least about 3 seconds, preferably about 5 seconds to about 10 seconds) of the second deposition step 60 and a flow rate of tetramethylsilane.

Figure 6:
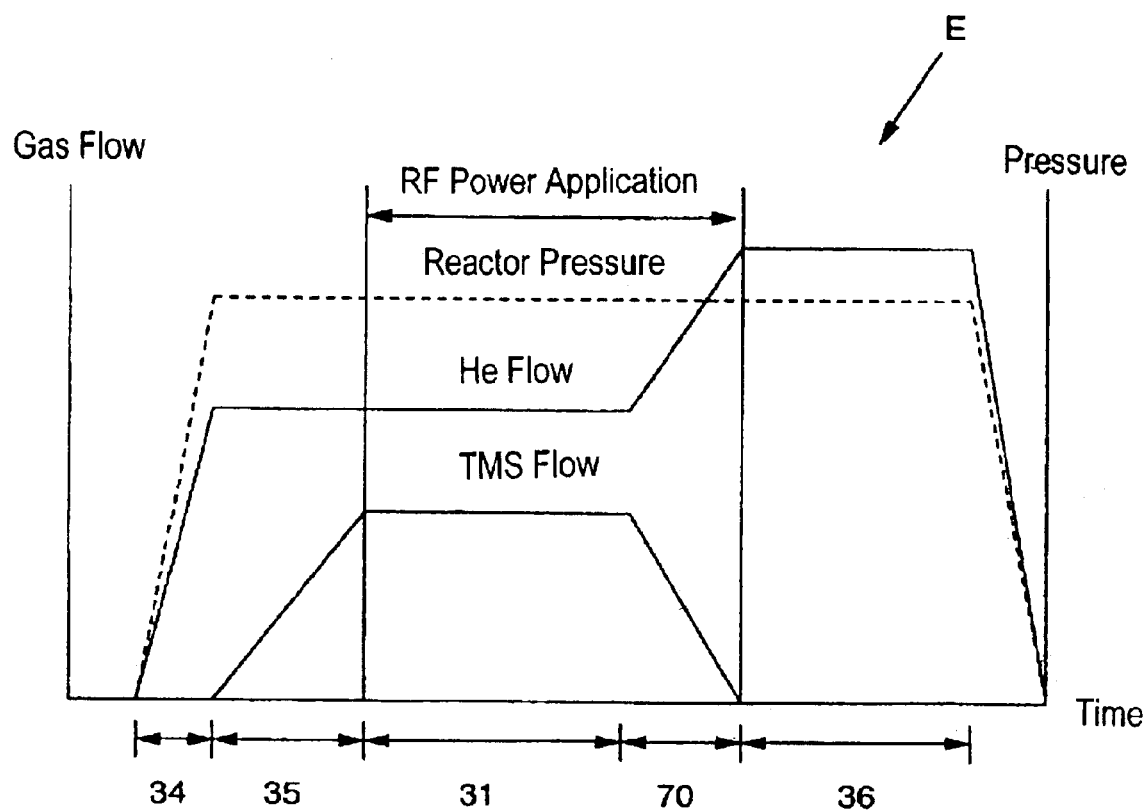
FIG. 6 is a diagram showing film formation control sequences (Sequence E) used for manufacturing a silicon carbide film according to still another embodiment of the present invention.

FIG. 6 shows a fifth embodiment of a deposition sequence used in the method of manufacturing the silicon carbide film according to the present invention. The Deposition Sequence E comprises reaction gas introduction steps (34, 35), deposition steps (31, 70) and a purge step 36. Because the reaction gas introduction steps and the purge step are the same as in the Deposition Sequence A shown in FIG. 2, descriptions are omitted. The deposition step of the Deposition Sequence E shown in FIG. 6 comprises the first deposition step 31 and the second deposition step 70. The first deposition step 31 is the same as the first deposition step 31 of the Deposition Sequence A. As for the Deposition Sequence E, in the second deposition step 70, by decreasing a flow rate of tetramethylsilane at a prescribed speed continuously to zero and at the same time increasing a flow rate of He at a prescribed speed continuously, a mixture ratio of the reaction gases is changed. Specifically, in the first deposition step 31, a mixture ratio of the reaction gases is about 100 sccm to about 1,000 sccm of tetramethylsilane to about 100 sccm to about 3,000 sccm of He; in the second deposition step 70, while a flow rate of tetramethylsilane is decreased to zero, a flow rate of He is increased up to about 500 sccm to about 10,000 sccm. Preferably, in the first deposition step 31, a mixture ratio of the reaction gases is about 200 sccm to about 500 sccm of tetramethylsilane to about 300 sccm to about 1,500 sccm of He; in the second deposition step 70, while a flow rate of tetramethylsilane is decreased to zero, a flow rate of He is increased up to about 1,000 sccm to about 5,000 sccm. More preferably, in the first deposition step 31, a mixture ratio of the reaction gases is about 200 sccm to about 500 sccm of tetramethylsilane to about 300 sccm to about 600 sccm of He; in the second deposition step 70, while a flow rate of tetramethylsilane is decreased to zero, a flow rate of He is increased to about 1,500 sccm to about 3,000 sccm. In the second deposition step 70, a flow decrease rate of tetramethylsilane and a flow increase rate of He are determined by the execution time (at least about 3 seconds, preferably about 5 seconds to about 10 seconds) of the second deposition step 70 and flow rates of tetramethylsilane and He in the first deposition step.

Flow rates of respective sequences mentioned above are applied when a silicon carbide film is deposited on a 200 mm silicon substrate. Application of the method according to the present invention, however, is not limited to 200 mm silicon substrates. If the method is applied to other sizes of substrates, flow rates of reaction gases are changed accordingly; a mixture ratio of the reaction gases, however, may be the same as mentioned in respective sequences.

Figure 8:
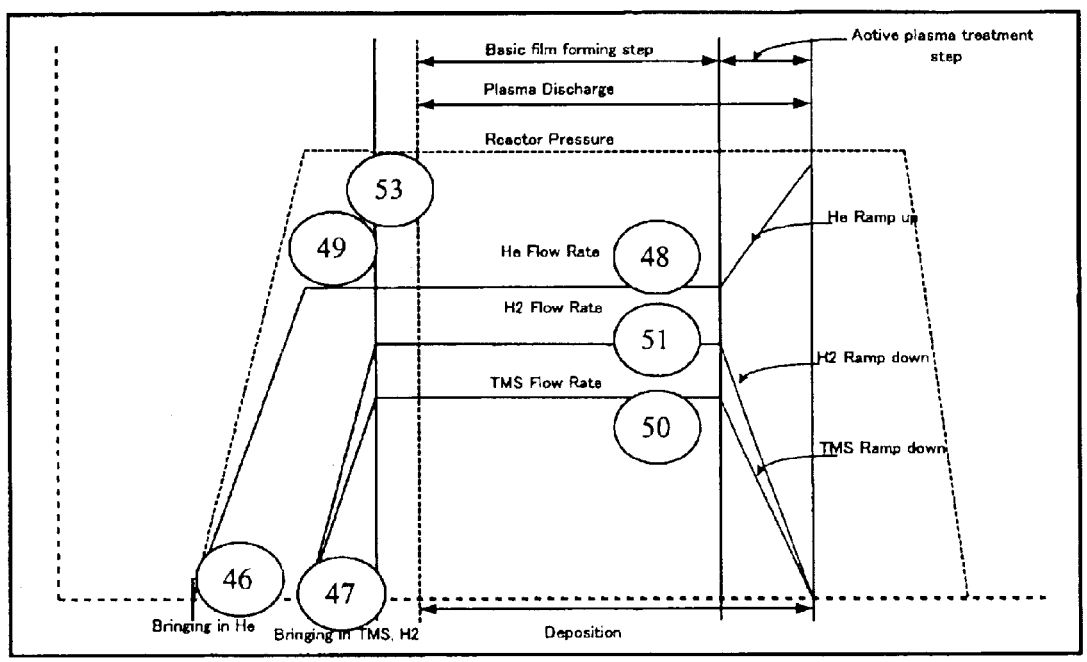
FIG. 8 is a diagram showing film formation control sequences using hydrogen gas used for manufacturing a silicon carbide film according to an embodiment of the present invention.

FIG. 8 shows another embodiment of the present invention using a hydrogen source gas. To deposit a silicon carbide layer on a 200 mm wafer, a reactive gas source such as tetra-methylsilane (TMS) and a substantial source of hydrogen such as hydrogen gas ($H_2$) are introduced into the reaction zone. Helium can be used as an inert gas. After a semiconductor substrate is carried into a reaction chamber and is heated at a given temperature, in step 46 "Bringing in He", helium 48, which is an inert gas, is brought into the reaction chamber at a determined flow within the range of about 100 sccm to about 3000 sccm, controlling the pressure inside the reaction chamber 49 at a determined value within the range of about 300 Pa to about 1000 Pa. In step 47 "Bringing in TMS, $H_2$", TMS 50 is brought into the reaction chamber at a determined flow within the range of about 200 sccm to about 500 sccm, $H_2$ 51 is brought into the reaction chamber at a determined flow within the range of about 10 sccm to about 1,000 sccm. For bringing in He, $H_2$, and TMS, a ramp-up method in which a flow of respective gases is increased from zero to a given value at a specific rate during predetermined time frames is adopted. This method is used to prevent floating of particles in the reaction chamber and adhering of the particles to the semiconductor substrate. Such a phenomenon is caused by a rise in a pressure in the reaction chamber resulted from drastic gas flow into the reaction chamber.

In this embodiment, once the gas flows including TMS, $H_2$, and He are stabilized as shown in step 53, RF power with a frequency of 27.12 MHz is applied in the range of about 200 W to about 1,000 W and RF power with a frequency 400 kHz is applied in the range of about 50 W to about 500 W. By doing the above steps, a silicon carbide film is formed.

In this embodiment, silicon carbide film deposition steps are divided into 2 steps. First, a basic film is formed on a substrate by flowing TMS, $H_2$, He and applying RF power as shown in FIG. 8 (TMS=300 sccm; $H_2$=50 sccm; He=400 sccm; 27.12 MHz at 400 W; 400 kHz at 95 W; substrate temperature=320° C.; chamber pressure=720 Pa). Second, an active plasma treatment step is performed. After the basic film formation step, second film formation is carried out continuously. In this step, Helium flow is increased while TMS flow and $H_2$ flow are decreased without changing plasma discharge. In this embodiment, the film formation is continued even during the active plasma treatment (TMS= Ramp down to 0 sccm; $H_2$=Ramp down to 0 sccm; He=Ramp up to 2.5 slm; 27.12 MHz at 400 W; 400 kHz at 95 W; substrate temperature=320° C.; chamber pressure= 720 Pa), because the raw material gas flow is not discontinuously decreased.

A silicon carbide film deposited by the basic film forming step alone is not stable, its film stress and dielectric constant changes when exposed to the air at room temperature. This is due to oxidation of the surface layer. The method of minimizing oxidation of carbon-containing films, such as SiC, is published in U.S. Pat. application Publication 2002/ 054962A1; however, no changes/improvements on the film properties are observed. Furthermore, when annealing is performed at 400° C. under nitrogen atmosphere for 10 hours, a drastic change in the film stress is observed. The change in the stress is about 400 MPa, which consequently indicates a poor thermal stress stability behavior. The principle of stabilizing the silicon carbide film by the active plasma step in this embodiment is substantially the same as that of the plasma CVD without hydrogen source gas.

When an active plasma treatment in this embodiment is performed on the silicon carbide films, the unstable phenomena of the film stress and dielectric constant are solved. Also the dielectric constant and leakage current are decreased.

The basic film properties of the silicon carbide film deposited above are shown in Table 5. Furthermore, no major changes either in dielectric constant (less than 5%) or in stress (less than 10%) of this film are observed even when exposed to the air at a temperature of 20° C. to 30° C. (room temperature).

Furthermore, when annealing is performed at 400° C. in a nitrogen atmosphere for 10 hours, a very small change in film stress (less than 50%) is observed. Silicon carbide films deposited according to embodiments of the present invention described above have good thermal stress behavior. As mentioned earlier, the introduction films with compressive stress provides better adhesion with copper. Due to little changes of the film stress, good adhesion behavior between a barrier insulating film and an inter dielectric layer is expected. The leakage current as measured at 1 MV/cm and the dielectric constant of a silicon carbide film may be less than $1\times10^{-9}$ $A/cm^2$ and less than 4.0, respectively, and thus silicon carbide films according to embodiments of the present invention are suitable to use as a copper diffusion barrier layer as well as an etch stopper.

Silicon carbide films deposited by the PECVD process described herein can have significantly lower leakage current, lower dielectric constant with compressive stress in comparison to conventional silicon carbide films. The silicon carbide films can be deposited without a mixture of low and high frequency. However, a preferred mixture of high and low radio frequency can correct adverse film properties caused by the bombardment of the silicon carbide film with molecules of inert gas. By increasing the ratio of Si—C bonds in the silicon carbide film, greater hardness and higher elastic modulus can be obtained in the film.

The following example illustrates a dual damascene structure in which a silicon carbide layer deposited according to the present invention can be used. FIGS. 9a–9i shows a dual damascene structure in which a silicon carbide layer deposited according to the present invention can be used. However, the present invention should not be limited to this embodiment.

A copper (Cu) layer 31 is first covered with a first silicon carbide layer 32. Since the silicon carbide layer 32 according to this embodiment is oxygen free with low leakage current and low dielectric constant, it is suggested to be the most suitable material to use as a copper diffusion barrier layer. Before depositing the silicon carbide layer 32, the copper surface can be improved by removing any copper oxide that may be remaining on the surface. Typically a hydrogen ($H_2$) or an ammonia ($NH_3$) or methane ($CH_4$) plasma based reduction is used before the deposition of silicon carbide layer 32. This copper surface reduction to remove CMP residue can be performed in a PECVD chamber.

Figure 9A:
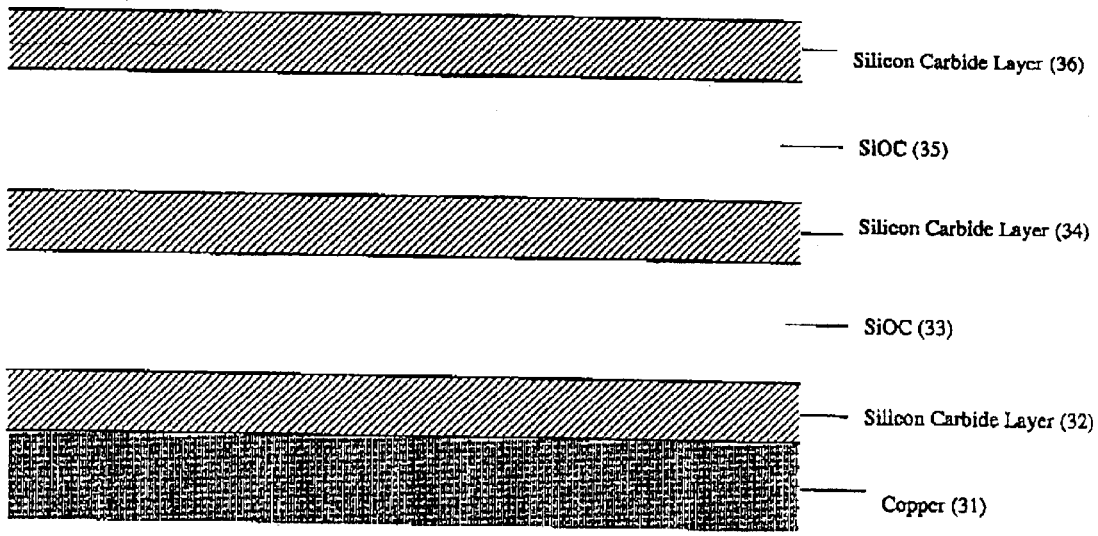
FIGS. 9a–9i are diagrams illustrating dual damascene structures in sequence in which a silicon carbide layer is used according to an embodiment of the present invention.
Figure 9B:
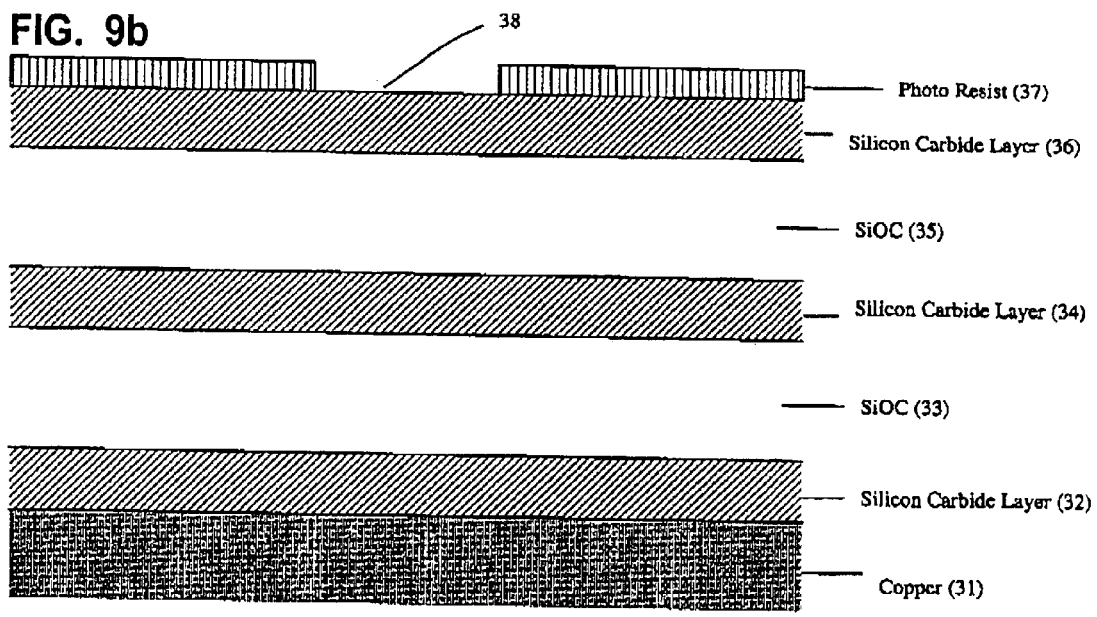
Figure 9C:
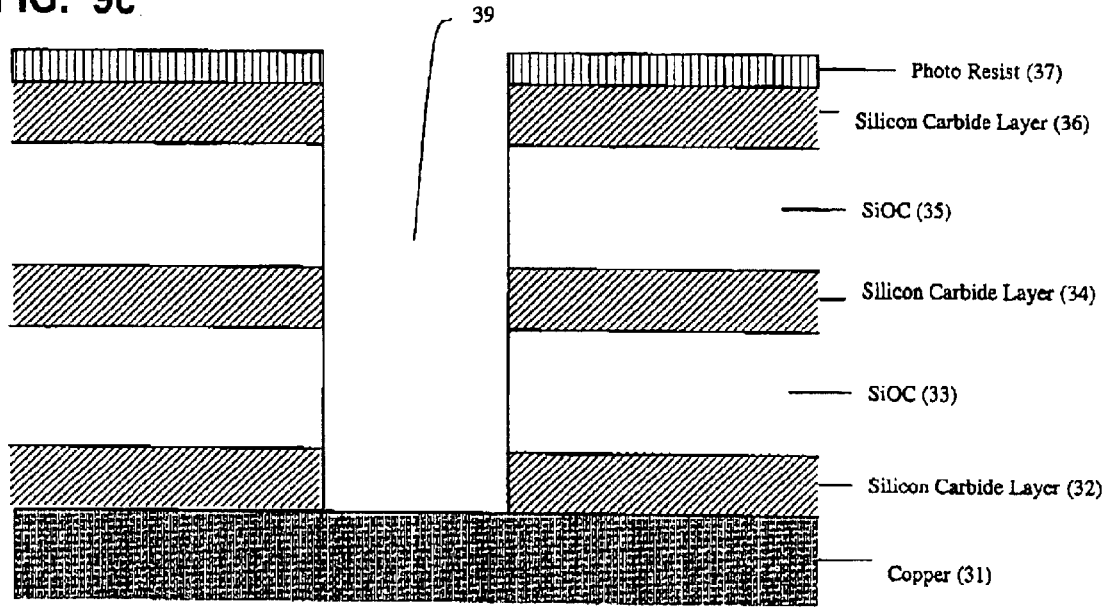

After the deposition of silicon carbide layer 32, a first inter level dielectric, in this case SiOC layer 33, is deposited. After the deposition of the SiOC layer 33, the second silicon carbide layer 34 and second inter level dielectric, in this case SiOC layer 35 and the silicon carbide layer 36, are deposited in sequence as shown in FIG. 9a. A photo resist 37 is then coated on top of the third silicon carbide layer 36 as shown in FIG. 9b. To form via holes and trenches, any suitable methods can be employed. The following is an example:

A via hole 39 is formed by etching. The process of forming a via hole is stated as follows: First a photo resist 37 is removed (38) as shown in FIG. 9b. Next, a via etching is commenced through the third silicon carbide layer 36 to the first silicon carbide layer 32 as shown in FIG. 9c. Finally, a portion of first silicon carbide layer 32 is etched to expose the metal line.

Figure 9D:
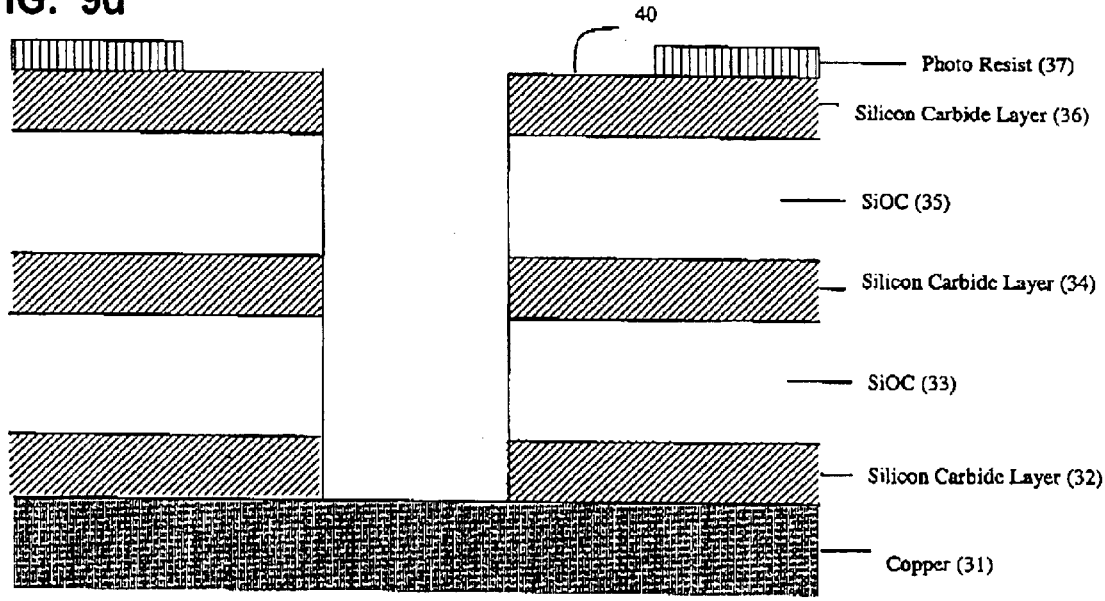
Figure 9E:
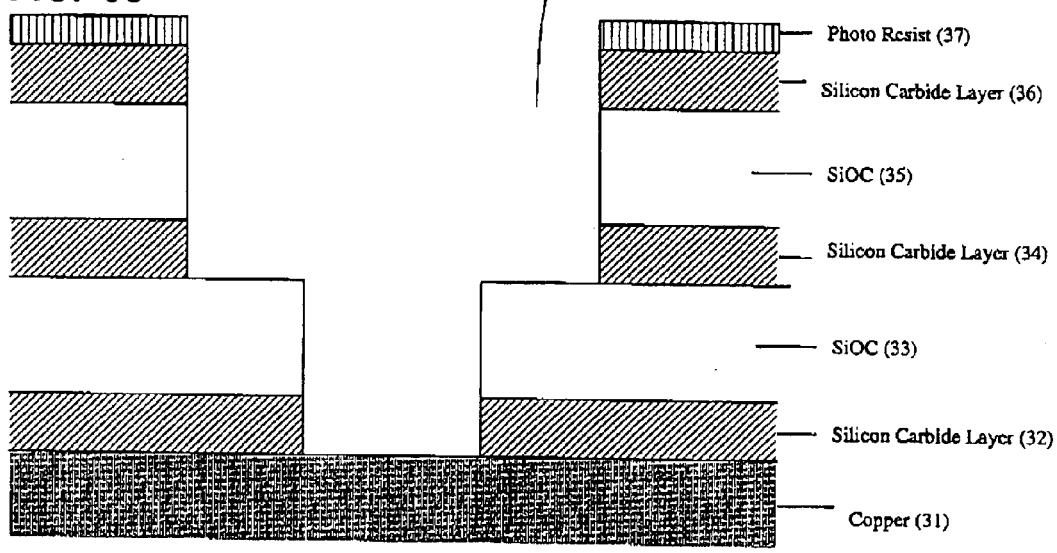

After via realization, trench patterning commences. First, a photo resist 37 is removed as shown in FIG. 9d. Next, trench 41 is formed through etching third silicon carbide layer 36 to second silicon carbide layer 34 as shown in FIG. 9e. The second silicon carbide layer 34 prevents the etching of the second SiOC layer 35 from continuing into the first SiOC layer 33.

Figure 9F:
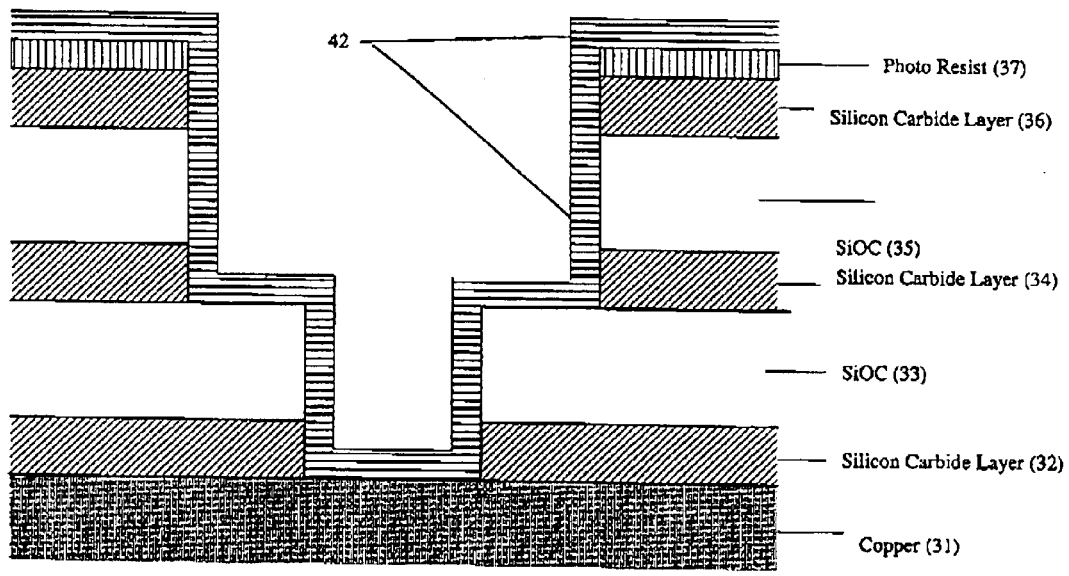
Figure 9G:
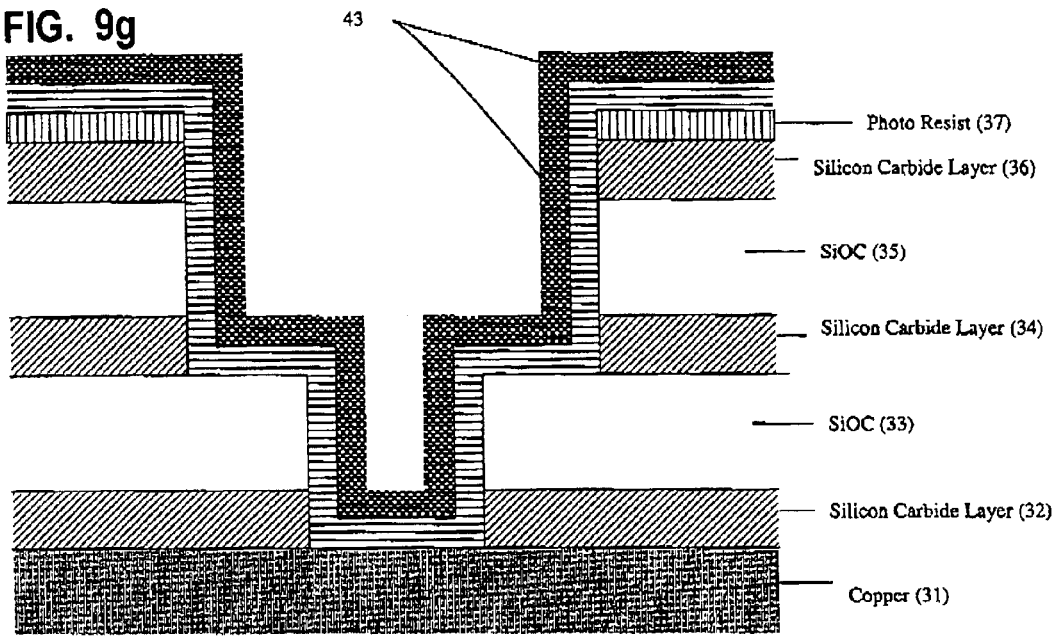
Figure 9H:
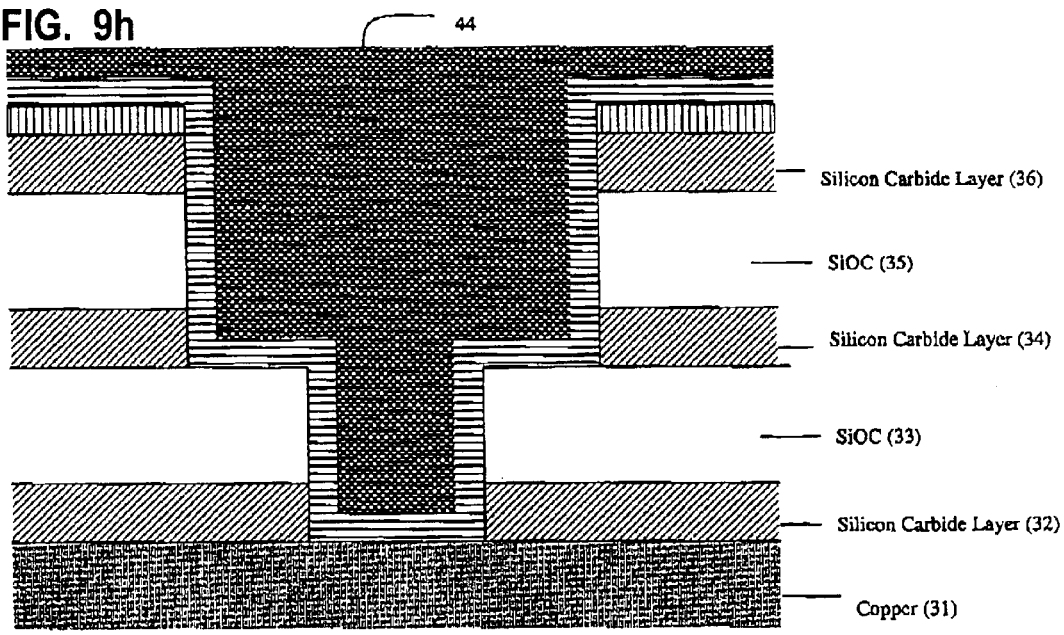
Figure 9I:
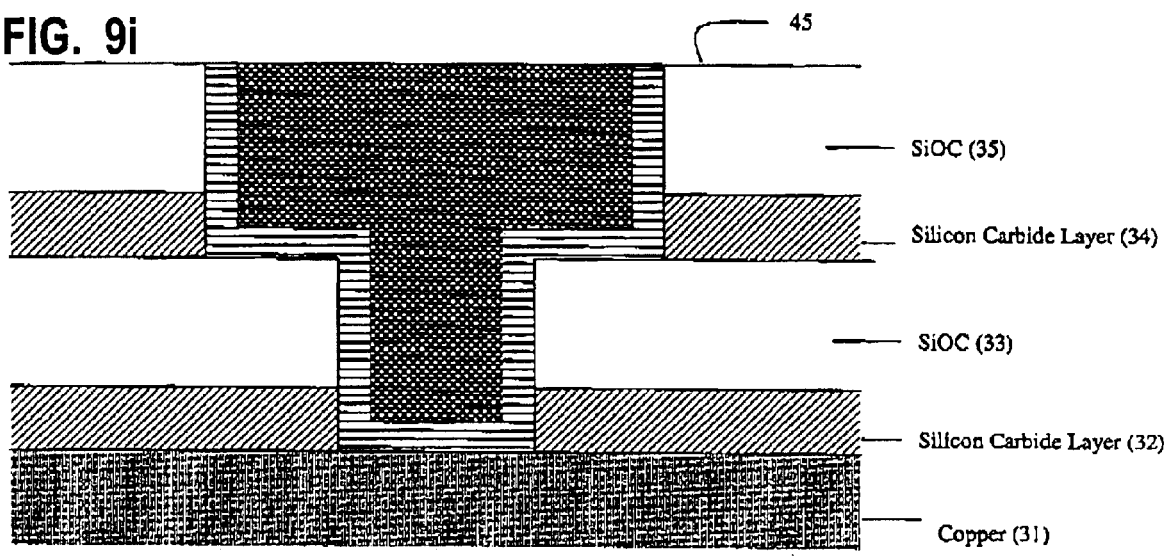

A copper barrier layer such as TaN or TiN 42, is formed inside the via hole, which also covers top of the resist as shown in FIG. 9f. A copper seed layer 43 is further deposited by PVD, or the like as shown in FIG. 9g. Thereafter copper 44 is then deposited in the hole by electric plating or the like as shown in FIG. 9h. By CMP or the like, the copper barrier layer 42, the copper 44, the resist 37 and the third silicon carbide layer 36, are removed so that the surface 45 is exposed as shown in FIG. 9i.

A silicon carbide layer can also be deposited as a passivation layer (not shown) for protecting the device from scratching. The silicon carbide dielectric diffusion barrier (DDB) layer is important as it effectively prevents copper diffusion into the SiOC layers. This is due to the DDB layer having a low leakage current.

The leakage current at 1 MV/cm and dielectric constant of conventional silicon carbide barrier layer are approximately $1 \times 10^{-7}$ A/cm$^2$ and 5.0, respectively; in contrast, approximately less than $1 \times 10^{-9}$ A/cm$^2$ and less than 4.0, respectively, in a silicon carbide barrier layer fabricated according to an embodiment of the present invention. Thus, using the conventional silicon carbide barrier layer, as opposed to the silicon carbide layer fabricated as described above, at an electric field of 2 MV/cm, the same effectiveness can be maintained in preventing the copper diffusion. Furthermore, the resulting silicon carbide layer has a relatively low dielectric constant, typically around 3.2 and 4.0, depending on the mixture and ratio of low frequency to the total frequency generated during deposition, and also depending on the ratio of gases used to form the silicon carbide film.

EXAMPLES

The invention will be explained with reference to the following embodiments. However, the invention should not be limited to the embodiments.

Examples 1 and 2

Comparative experiments of silicon carbide films deposited by conventional methods and silicon carbide films deposited by the method according to embodiments of the present invention were conducted. Silicon carbide films were deposited on semiconductor substrates (200 mm silicon substrates) under the deposition conditions described below. The plasma CVD apparatus shown in FIG. 1 was used for the deposition process. As reaction gases, tetramethylsilane (TMS) and helium (He) were used except for Example 2 wherein TMS and Ar were used.

1) Comparative Example 1

| Deposition Temp. | TMS Flow Rate | He Flow Rate | Reaction Chamber Pressure | 27.12 MHz | 400 kHz |
|---|---|---|---|---|---|
| 360° C. | 700 sccm | 3,150 sccm | 665 Pa | 650 W | 180 W |

2) Comparative Example 2

| Deposition Temp. | TMS Flow Rate | He Flow Rate | Reaction Chamber Pressure | 27.12 MHz | 400 kHz |
|---|---|---|---|---|---|
| 330° C. | 700 sccm | 3,150 sccm | 665 Pa | 650 W | 180 W |

3) Comparative Example 3
(He plasma process was conducted for 15 sec. immediately after the deposition step)

| Deposition Temp. | TMS Flow Rate | He Flow Rate | Reaction Chamber Pressure | 27.12 MHz | 400 kHz |
|---|---|---|---|---|---|
| 330° C. | 700 sccm | 3,150 sccm | 665 Pa | 650 W | 180 W |

4) Example 1
(Sequence F)
First Deposition Step:

| Deposition Temp. | TMS Flow Rate | He Flow Rate | Reaction Chamber Pressure | 27.12 MHz | 400 kHz |
|---|---|---|---|---|---|
| 330° C. | 300 sccm | 500 sccm | 600 Pa | 400 W | 150 W |

Second Deposition Step (Execution time: 8 seconds):

| Deposition Temp. | TMS Flow Rate | He Flow Rate | Reaction Chamber Pressure | 27.12 MHz | 400 kHz |
|---|---|---|---|---|---|
| 330° C. | 0 sccm | 2,500 sccm | 600 Pa | 400 W | 150 W |

5) Example 2
(Sequence F; Ar was used as an inert gas.)
First Deposition Step:

| Deposition Temp. | TMS Flow Rate | Ar Flow Rate | Reaction Chamber Pressure | 27.12 MHz | 400 kHz |
|---|---|---|---|---|---|
| 330° C. | 300 sccm | 500 sccm | 600 Pa | 400 W | 150 W |

Second Deposition Step (Execution time: 8 seconds):

| Deposition Temp. | TMS Flow Rate | Ar Flow Rate | Reaction Chamber Pressure | 27.12 MHz | 400 kHz |
|---|---|---|---|---|---|
| 330° C. | 0 sccm | 2,500 sccm | 600 Pa | 400 W | 150 W |

Figure 7:
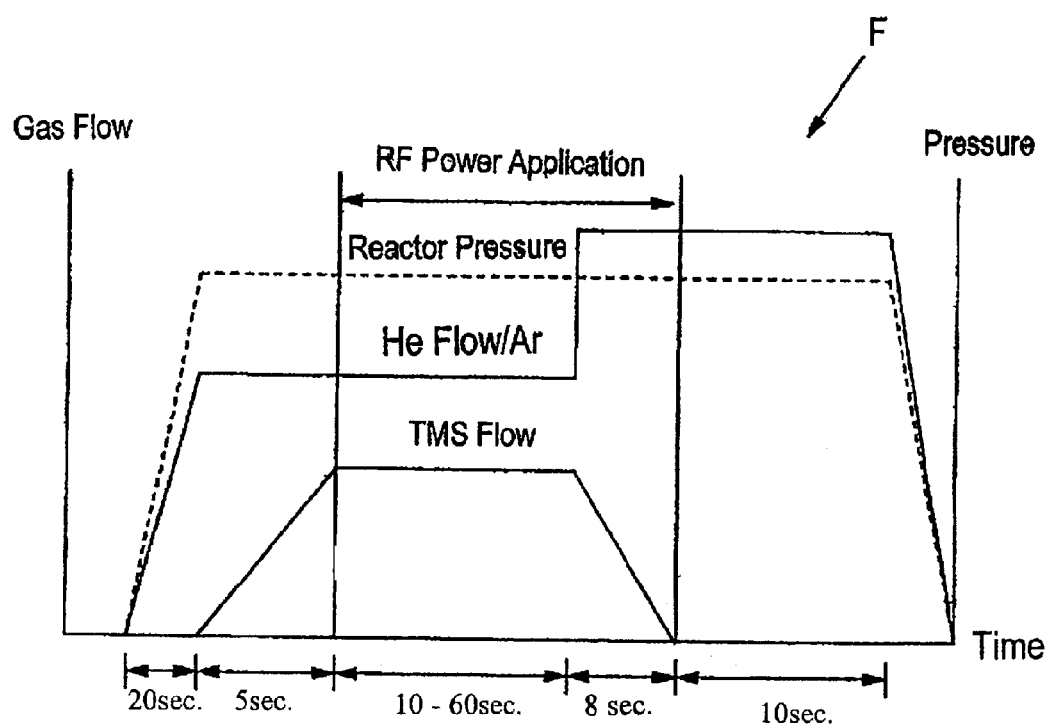
FIG. 7 is a diagram showing film formation control sequences (Sequence F) used for manufacturing a silicon carbide film according to yet another embodiment of the present invention.

In Examples 1 and 2, Sequence F was applied which is shown in FIG. 7. That is, the flow rate of the raw material gas was discontinuously increased, whereas the flow rate of the inert gas was continuously decreased to zero. As with the other figures, the axes of FIG. 7 are not accurately proportioned to the actual values. The time period (sec.) of each process is indicated with actual numbers in FIG. 7.

Experiments were conducted to evaluate characteristics of silicon carbide films deposited under the above-mentioned deposition conditions. The following characteristics were evaluated: dielectric constants of the films, change in film stress after the films were left in the atmosphere for one hour, change in film stress after a semiconductor substrate was heated up to 400° C. after the film had been deposited, and leakage current values when a voltage of 1 MV/cm was applied. Table 4 shows evaluation results of the characteristics of the silicon carbide films deposited under the above-mentioned deposition conditions.

TABLE 4

| | Dielectric constant | Stress Change in Atmosphere (MPa) | Stress Change before and after annealing (MPa) | Leakage Current ($\times 10^{-8}$ A/cm$^2$) |
|---|---|---|---|---|
| Comparative Example 1 | 4.9 | −10 | 480 | 8.6 |
| Comparative Example 2 | 4.7 | −65 | 370 | 1.7 |
| Comparative Example 3 | 4.7 | −15 | 375 | 1.0 |
| Example 1 | 3.8 | −3 | 100 | 0.20 |
| Example 2 | 3.9 | −5 | 50 | 0.15 |

From the evaluation results of the dielectric constants, as compared with the silicon carbide films in Comparative Examples 1 to 3 whose dielectric constants are high, which are 4 or higher, it is seen that the silicon carbide films of Examples 1 and 2, which were deposited by the method according to the present invention, attained low dielectric constants of 4 or lower.

From the evaluation results of the change in film stress in the atmosphere, it is seen that in the case of the silicon carbide film in the Comparative Example 2, its film quality was changed as the result of a film stress change only by 65 MPa in the direction of the pressure applied. As compared with the Comparative Example 2, in the case of the silicon carbide films in the Comparative Examples 1 and 3, their film stress changes in the atmosphere are small and the film stress appears to be relatively stable. As to the change in film stress before and after the heating, however, it is seen that film stress changes of above 300 Pa occurred in the silicon carbide films in any one of the Comparative Examples 1 to 3. In the manufacturing process of multilayer interconnects for LSI devices, because semiconductor substrates are exposed to an environment at approximately 400° C., there is a risk that a boundary of films contacting each other may exfoliate. Consequently, it can be said that the silicon carbide films in the Comparative Examples 1 to 3 are inadequate for use in LSI devices.

In contrast, in the case of silicon carbide films in the Examples 1 and 2, stress changes in the atmosphere hardly occurred at all and the films were exceedingly stable. Additionally, stress change before and after the heating was 100 MPa or less, which was extremely small as compared with the changes in the comparative examples. From these results, it is seen that the silicon carbide films in the Embodiments 1 and 2 have an extremely stable structure down to inside.

As to leakage current values, the Examples 1 and 2 show extremely small leakage values as compared with the Comparative Examples 1 to 3; the results tell that the silicon carbide films in the Examples 1 and 2 have high insulation performance. A leakage current level of a silicon carbide film which is applicable to LSI devices is preferably $1.0 \times 10^{-8}$ A/cm$^2$ or less when a voltage of 1 MV/cm is applied. The silicon carbide films in the Examples 1 and 2 meet this condition.

For the purpose of reference, under the deposition conditions in the Example 1, characteristics of a silicon carbide film without the second deposition step were examined. As a result, immediately after the deposition, its dielectric constant was 4.07 and its film stress was −98 MPa; after the film was left in the atmosphere for one week, the film's dielectric constant changed to 4.16 and its film stress changed to −300 MPa.

Example 3

The film formation was conducted according the deposition conditions shown in Table 5 below.

TABLE 5

| Parameter | Step 1 | Step 2 |
|---|---|---|
| Tetra-methylsilane (TMS) flow rate (sccm) | 300 | Ramp down to 0 sccm |
| Hydrogen (H$_2$) flow rate (sccm) | 50 | Ramp down to 0 sccm |
| Helium (He) flow rate (sccm) | 400 | Ramp up to 2500 sccm |
| Pressure (Pa) | 720 | 720 |
| Low RF Power (W) | 95 | 95 |
| High RF Power (W) | 400 | 400 |
| Substrate Temperature (° C.) | 320 | 320 |

An as-deposited silicon carbide layer has a dielectric constant and leakage current at 1 MV/cm of less than about 4.0 and $1 \times 10^{-9}$ A/cm$^2$, respectively, making it suitable for use as an insulating material in integrated circuits. The details of the film properties such as dielectric constant, leakage current and film stress of the silicon carbide layer deposited according to the deposition conditions shown in Table 5 are shown in Table 6. The dielectric constant of the silicon carbide layer is tunable, in that it can be varied as a function of the ratio of the mixed frequency RF powers. In particular, as the ratio of the low frequency RF power to the total mixed powers decreases, the dielectric constant of the silicon carbide layer also decreases. Also as the flow rate of TMS increases, the dielectric constant of the silicon carbide layer decreases.

The dielectric constant of the silicon carbide layer can also be tuned as a function of the composition of the gas mixture during layer formation. As the carbon concentration in the gas mixture increases, the carbon content of the as-deposited silicon carbide layer increases, making the silicon carbide film less dense and dielectric constant decrease. Also, as the carbon concentration of the as deposited silicon carbide layer increases, the hydrophobic properties thereof increases making such layers suitable for use as moisture barriers in integrated circuits.

In addition, the as-deposited silicon carbide layer has no oxygen content. It is believed that such an oxygen free silicon carbide layer minimizes metal diffusion and improves the barrier layer properties. For example, the as-deposited silicon carbide layer has a current blocking ability at 1 MV/cm that is less than that of about $1\times10^{-9}$ A/cm$^2$, which is suitable for minimizing cross-talk between integrated circuit interconnect structures.

The etching performance of silicon carbide materials shows that the etch selectivity, based on the RIE (reactive ion etching) mode, between SiOC and silicon carbide described herein was from about 5 to about 10.

TABLE 6

| Film type | Film Stress Compressive (MPa) | Dielectric constant | Leakage current at 1 MV/cm (A/cm$^2$) |
|---|---|---|---|
| SiC | 40 ± 5 | 3.6 ± 0.1 | <5 × 10$^{-10}$ |

As described above, the present invention includes various embodiments. In an embodiment, a method of manufacturing a silicon carbide film on a semiconductor wafer by plasma CVD comprises the steps of: bringing gases comprising a raw material gas containing silicon, carbon, and hydrogen at a given flow rate, an inert gas at a given flow rate, and optionally a hydrogen source gas into a reaction chamber, applying at least one type of radio-frequency power to a reaction zone inside the reaction chamber and changing a mixture ratio of the raw material gas, the inert gas, and optionally the hydrogen source gas included in the gases while at least one type of radio-frequency power is applied.

Specifically, the step of changing the mixture ratio may comprise a step of decreasing only a flow rate of the raw material gas discontinuously, increasing only a flow rate of the inert gas discontinuously, or decreasing a flow rate of the raw material gas discontinuously and at the same time as increasing a flow rate of the inert gas discontinuously.

In this case, a flow ratio of the inert gas to the raw material gas after the mixture ratio is changed may be about 5 to about 100.

Alternatively, the step of changing the mixture ratio may comprise a step of decreasing only a flow rate of the raw material gas continuously, increasing only a flow rate of the inert gas continuously, or decreasing a flow rate of the raw material gas continuously and at the same time as increasing a flow rate of the inert gas continuously.

In this case, a flow rate of the raw material gas may reduce continuously to zero.

The hydrogen source gas flow can be controlled by synchronizing the flow with the raw material gas flow or by decreasing the flow independently of the raw material gas flow.

Using a method according to an embodiment of the present invention, a silicon carbide film having a dielectric constant of 4 or less, whose dielectric constant and film stress do not substantially change and are stable when it is left in the atmosphere, whose leakage current is small and which can be used as an etch stop film for copper wiring can be provided.

The silicon carbide film deposited by a method according to an embodiment of the present invention comprises Si, C, and H. Because this silicon carbide film has chemical composition different from that of a carbon-containing silicon oxide film (SiCOH) used as an interlayer insulating film for LSI devices, it is etched at an etching rate 10 times slower than that of the carbon-containing silicon oxide film. Consequently, it has become easy to form vias or trenches for copper wiring as designed.

In plasma CVD using a hydrogen source gas, a silicon carbide film having especially low leakage current and low dielectric constant can be formed.

Thus, the method of forming etch stop layers and copper diffusion barrier layers can effectively be employed in the next generation, 100 nm/65 nm-nodes Ultra Large Scale Integration (ULSI) technologies, where the copper damascene structures are used.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming a silicon carbide film on a semiconductor substrate by plasma CVD, comprising the steps of:

(a) introducing a raw materials as containing silicon, carbon, and hydrogen and an inert gas at a predetermined mixture ratio of the raw material gas to the inert gas into a reaction chamber;

(b) applying radio-frequency power to a reaction zone inside the reaction chamber at the mixture ratio, thereby forming on a semiconductor substrate a curable silicon carbide film having a dielectric constant of about 4.0 or higher; and (c) continuously applying radio-frequency power to the reaction zone at a mixture ratio which is reduced from that in step (b), thereby curing the silicon carbide film to give a dielectric constant lower than that of the curable silicon carbide film, wherein in step (a), in addition to the raw material gas and the inert gas, a hydrogen source gas is introduced into the reaction chamber, and wherein in step (c), the hydrogen source gas flow is changed by synchronizing the hydrogen source gas flow with the raw material gas flow.

2. A method for forming a silicon carbide film on a semiconductor substrate by plasma CVD, comprising the steps of:

(a) introducing a raw materials as containing silicon, carbon, and hydrogen and an inert gas at a predetermined mixture ratio of the raw material gas to the inert gas into a reaction chamber;

(b) applying radio-frequency power to a reaction zone inside the reaction chamber at the mixture ratio, thereby forming on a semiconductor substrate a curable silicon carbide film having a dielectric constant of about 4.0 or higher; and (c) continuously applying radio-frequency power to the reaction zone at a mixture ratio which is reduced from that in step (b), thereby curing the silicon carbide film to give a dielectric constant lower than that of the curable silicon carbide film, wherein in step (a), in addition to the raw material gas and the inert gas, a hydrogen source gas is introduced into the reaction chamber, and wherein in step (c), the hydrogen source gas flow is reduced from that in step (b).

3. The method according to claim 2, wherein the hydrogen source gas flow is reduced to about zero at the end of step (c).

4. The method according claim 2, wherein the radio-frequency power is comprised of low frequency power and high-frequency power.

5. The method according to claim 4, wherein the low frequency power is less than about ½ of the total power.

6. The method according to claim 2, wherein the hydrogen source gas flow is about 10 sccm to about 5,000 sccm in step (b).

7. The method according to claim 2, wherein the hydrogen source gas flow is about 0 sccm to about 1,000 sccm in step (c).

8. The method according to claim 2, wherein step (c) is conducted for about 5 seconds to about 10 seconds.

9. A method for manufacturing on a semiconductor substrate an interlayer structure containing a film in contact with a copper layer, comprising the steps of:
  (i) forming multiple layers on a semiconductor substrate;
  (ii) forming a hole for an interlayer connection of the multiple layers by etching;
  (iii) depositing copper in the hole;
  (iv) removing an excess of the copper from a top of the multiple layers;
  (v) depositing a silicon carbide film n the top of the multiple layers according to claim 2, whereby the copper is covered by the silicon carbide film.

10. The method according to claim 9, wherein in step (i), the multiple layers comprise a lower etch stop layer, a lower low dielectric layer, an intermediate etch stop layer, an upper low dielectric layer, and an upper etch stop layer laminated in sequence on the substrate, and in step (ii), the hole is produced by forming a resist on top of the upper etch stop layer and forming a via hole and trench by etching the multiple layers using the resist, and in step (iv), the resist and the upper etch stop layer are removed when removing the excess of the copper.

11. The method according to claim 10, wherein the lower etch stop layer, the intermediate etch stop layer, and the upper etch stop layer are silicon carbide films, each formed by plasma CVD comprising the steps of:
  (A) introducing a raw material gas containing silicon, carbon, and hydrogen, a hydrogen source gas, and an inert gas at a predetermined mixing formulation of the raw material gas, the hydrogen source gas, and the inert gas into a reaction chamber;
  (B) applying radio-frequency power to a reaction zone inside the reaction chamber at the mixing formulation, thereby forming a curable silicon carbide film on the semiconductor substrate; and
  (C) continuously applying radio-frequency power to the reaction zone at a mixing formulation wherein the hydrogen source gas flow is reduced from that in step (B), thereby curing the silicon carbide film to give a dielectric constant and leakage current lower than those of the curable silicon carbide film.

12. The method according to claim 10, wherein steps (i) through (iv) are repeated at least once.

13. A method for forming a silicon carbide film on a semiconductor substrate by plasma CVD, comprising the steps of:
  (a) forming a curable silicon carbide film having a dielectric constant of more than about 4.0 on a semiconductor substrate placed in a reaction chamber, by introducing a raw material gas containing silicon, carbon, and hydrogen at a given flow rate, and an inert gas at a given flow rate into the reaction chamber, and applying radio-frequency power to a reaction zone inside the reaction chamber; and
  (b) curing the silicon carbide film to give a dielectric constant of no more than about 4.0 by discontinuously or continuously reducing and then maintaining a mixture ratio of the raw material gas to the inert gas while continuously applying radio-frequency power to the reaction zone,
  wherein in step (a), in addition to the raw material gas and the inert gas, a hydrogen source gas is introduced into the reaction chamber, and wherein in step (b), the hydrogen source gas flow is changed by synchronizing the hydrogen source gas flow with the raw material gas flow.

14. A method for forming a silicon carbide film on a semiconductor substrate by plasma CVD, comprising the steps of:
  (a) forming a curable silicon carbide film having a dielectric constant of more than about 4.0 on a semiconductor substrate placed in a reaction chamber, by introducing a raw material gas containing silicon, carbon, and hydrogen at a given flow rate, and an inert gas at a given flow rate into the reaction chamber, and applying radio-frequency power to a reaction zone inside the reaction chamber; and
  (b) curing the silicon carbide film to give a dielectric constant of no more than about 4.0 by discontinuously or continuously reducing and then maintaining a mixture ratio of the raw material gas to the inert gas while continuously applying radio-frequency power to the reaction zone,
  wherein in step (a), in addition to the raw material gas and the inert gas, a hydrogen source gas is introduced into the reaction chamber and wherein in step (b) the hydrogen source gas flow is reduced from that in step (a).

15. The method according to claim 14, wherein the hydrogen source gas flow is reduced to zero at the end of step (c).

* * * * *

UNITED STATES PATENT AND TRADEMARK OFFICE
CERTIFICATE OF CORRECTION

PATENT NO.        : 6,991,959 B2
APPLICATION NO. : 10/722179
DATED               : January 31, 2006
INVENTOR(S)      : Kamal Kisho Goundar It is certified that error appears in the above-identified patent and that said Letters Patent is hereby corrected as shown below:

At column 6, line 25 (approx.), please delete "alternatively," and insert -- Alternatively, --, therefor.

At column 26, line 25 (approx.), in Claim 1, please delete "materials as" and insert -- material gas --, therefor.

At column 26, line 49 (approx.), in Claim 2, please delete "material as" and insert -- material gas --, therefor.

At column 27, line 4, in Claim 4, after "according" please insert -- to --.

At column 27, line 27, in Claim 9, please delete "n" and insert -- on --, therefor.

At column 27, line 56 (approx.), in Claim 11, please delete "in" and insert -- of --, therefor.

At column 28, line 48, in Claim 14, after "chamber" please insert -- , --.

At column 28, line 48, in Claim 14, after "(b)" please insert -- , --.

Signed and Sealed this

Tenth Day of October, 2006

JON W. DUDAS
*Director of the United States Patent and Trademark Office*